United States Patent
Miyazaki

(10) Patent No.: US 7,132,737 B2
(45) Date of Patent: Nov. 7, 2006

(54) PACKAGE FOR ELECTRONIC COMPONENT AND METHOD OF MANUFACTURING PIEZOELECTRIC DEVICE

(75) Inventor: Katsuhiko Miyazaki, Minowa-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/041,253

(22) Filed: Jan. 25, 2005

(65) Prior Publication Data

US 2005/0184625 A1 Aug. 25, 2005

(30) Foreign Application Priority Data

Jan. 29, 2004 (JP) .............................. 2004-021552
Dec. 22, 2004 (JP) .............................. 2004-370811

(51) Int. Cl.
*H01L 23/02* (2006.01)

(52) U.S. Cl. ...................... 257/678; 257/703; 257/728; 257/619; 257/415; 257/E23.001; 257/E23.01; 257/E23.044; 331/68

(58) Field of Classification Search ................ 257/678, 257/703, 728, 415, 416, 417, 418, 419, 420, 257/619; 331/68
See application file for complete search history.

(56) References Cited

U.S. PATENT DOCUMENTS

| 5,382,929 | A | * | 1/1995 | Inao et al. .................. 333/187 |
| 5,585,687 | A | * | 12/1996 | Wakabayashi et al. ...... 310/366 |
| 5,841,217 | A | * | 11/1998 | Kizaki et al. ................ 310/348 |
| 5,949,294 | A | * | 9/1999 | Kondo et al. .................. 331/68 |
| 6,229,249 | B1 | * | 5/2001 | Hatanaka et al. ........... 310/348 |
| 6,369,487 | B1 | * | 4/2002 | Kameda et al. ............. 310/320 |
| 6,833,654 | B1 | * | 12/2004 | Rubach ....................... 310/344 |
| 2004/0195691 | A1 | * | 10/2004 | Moriyasu et al. ........... 257/758 |
| 2004/0217673 | A1 | | 11/2004 | Unno et al. |

FOREIGN PATENT DOCUMENTS

| JP | A 07-074581 | 3/1995 |
| JP | A 10-308642 | 11/1998 |
| JP | A 11-214950 | 8/1999 |
| JP | A 2004-153451 | 5/2004 |

* cited by examiner

*Primary Examiner*—Minhloan Tran
*Assistant Examiner*—Eduardo A. Rodela
(74) *Attorney, Agent, or Firm*—Oliff & Berridge, PLC

(57) ABSTRACT

Aspects of the invention provide a package for accommodating a piezoelectric resonator that can include more mounting electrodes than connecting electrodes of the piezoelectric resonator element. The mounting electrodes can be electrically connected with a wiring pattern. In the lower surface of a package body, there can be formed external terminals at the four corners thereof. The external terminals are bonded to a mounting board. The external terminals are electrically connected to the mounting electrodes, respectively. The external terminal is not connected electrically to either of the mounting electrodes. Therefore, positions of the external terminals for operating the piezoelectric resonator can be changed based on whether a pair of connecting electrodes of the piezoelectric vibration element is bonded to the mounting electrodes, or it is connected to the mounting electrodes. Accordingly, it can be possible to easily change positions of external terminals for connecting to a circuit on a board.

12 Claims, 17 Drawing Sheets

F I G. 5
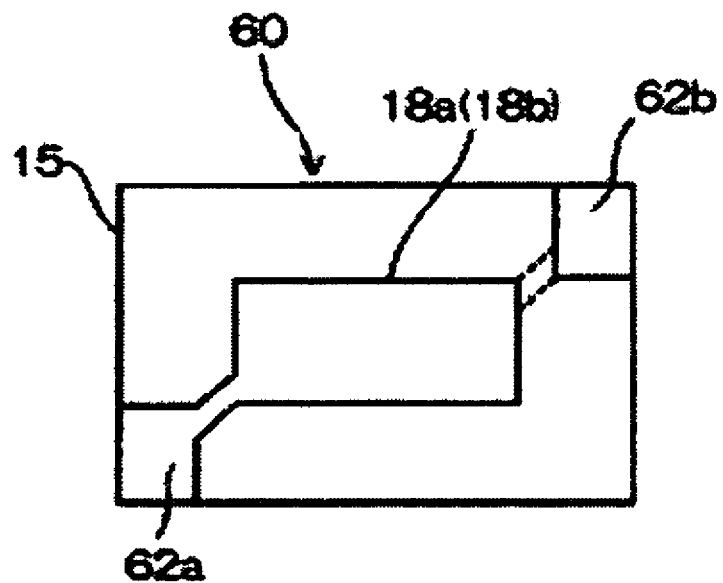
F I G. 6
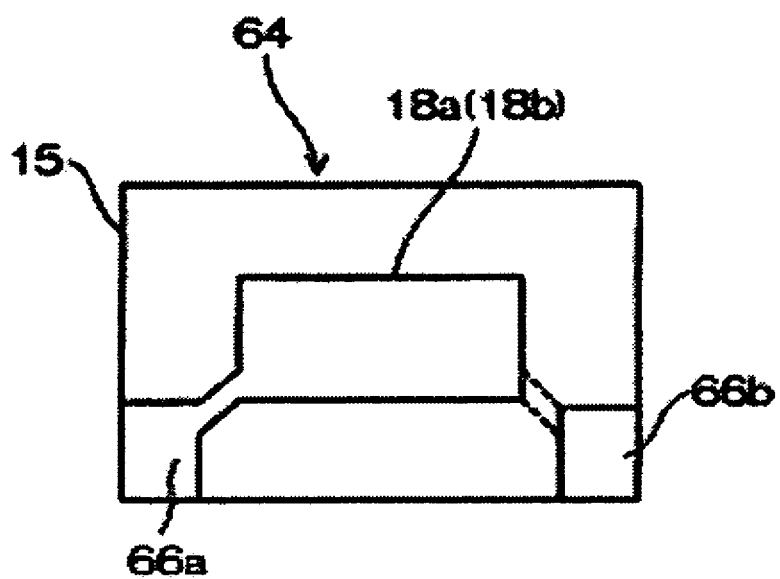

F I G. 7
(1)
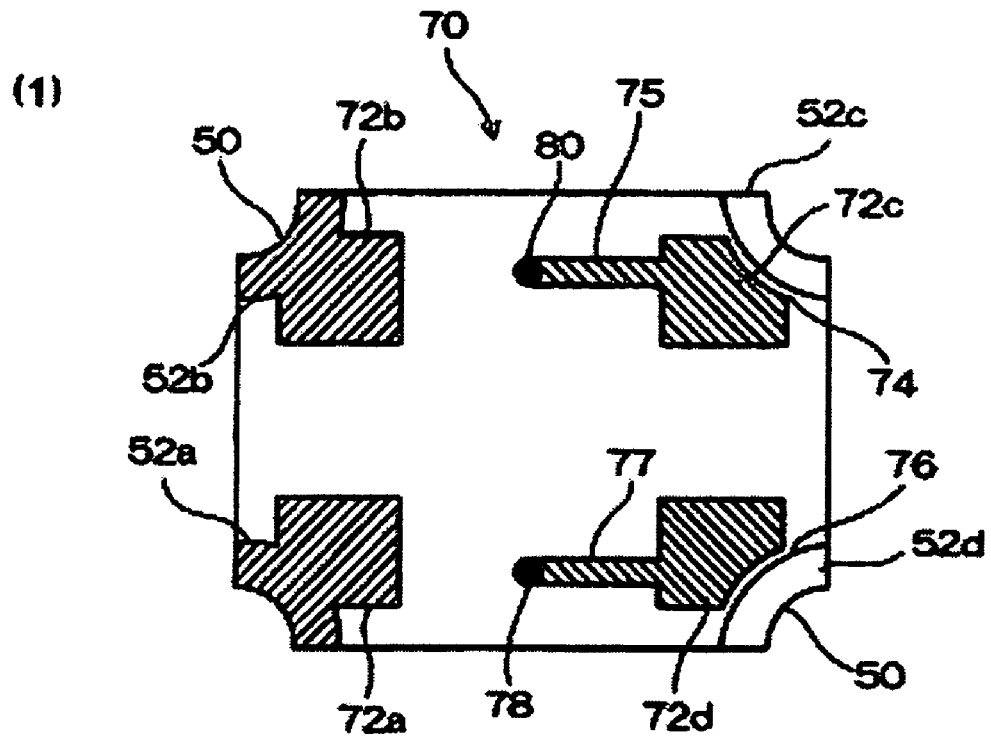
(2)
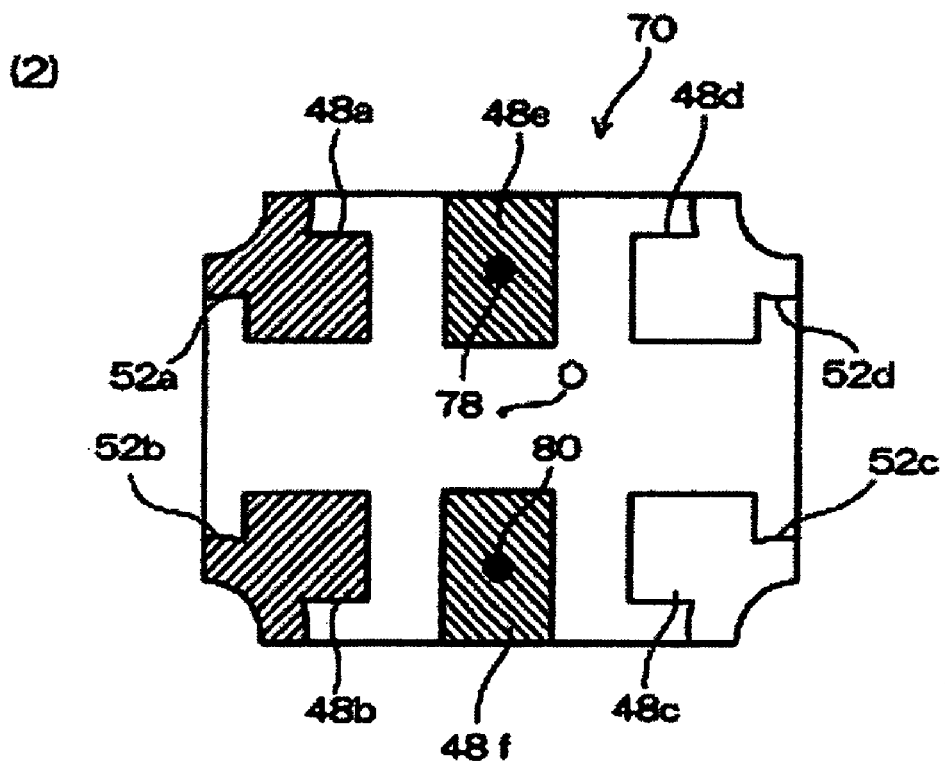

F I G. 10
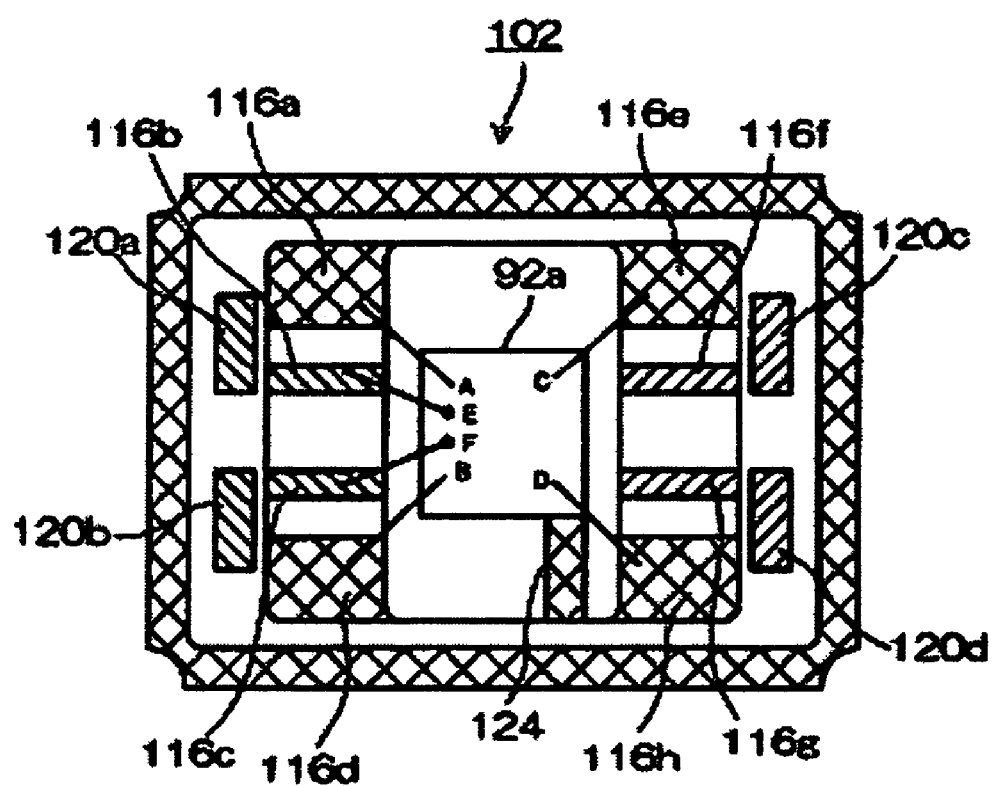

(1)

(2)

(3)

F I G. 12
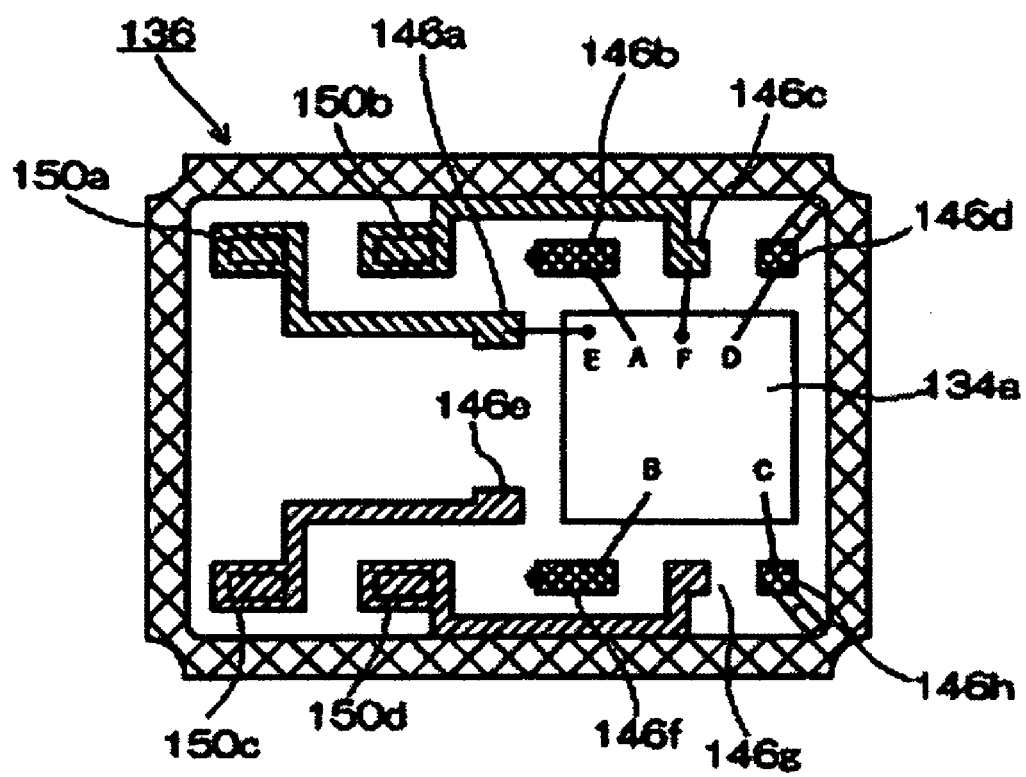

F I G. 14
(1)
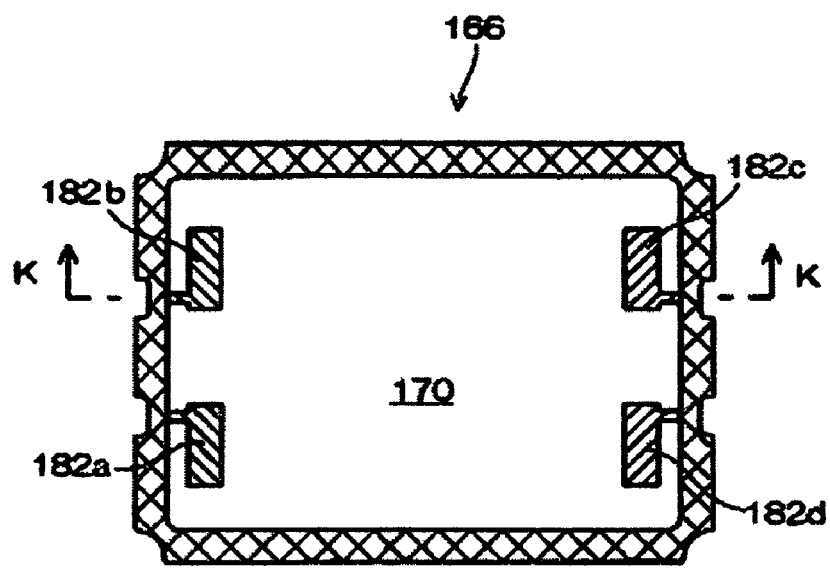
(2)
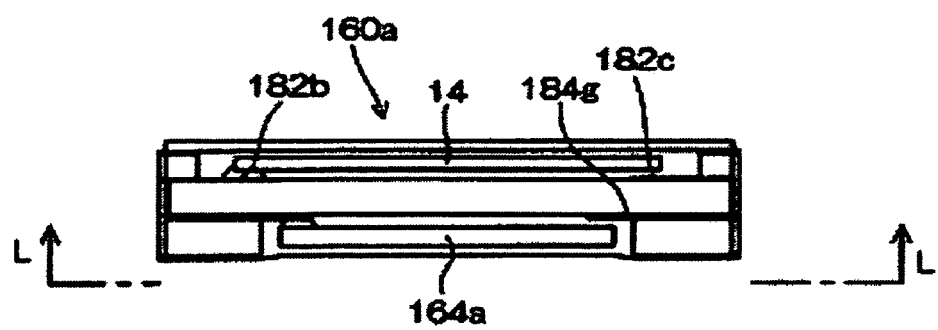
(3)
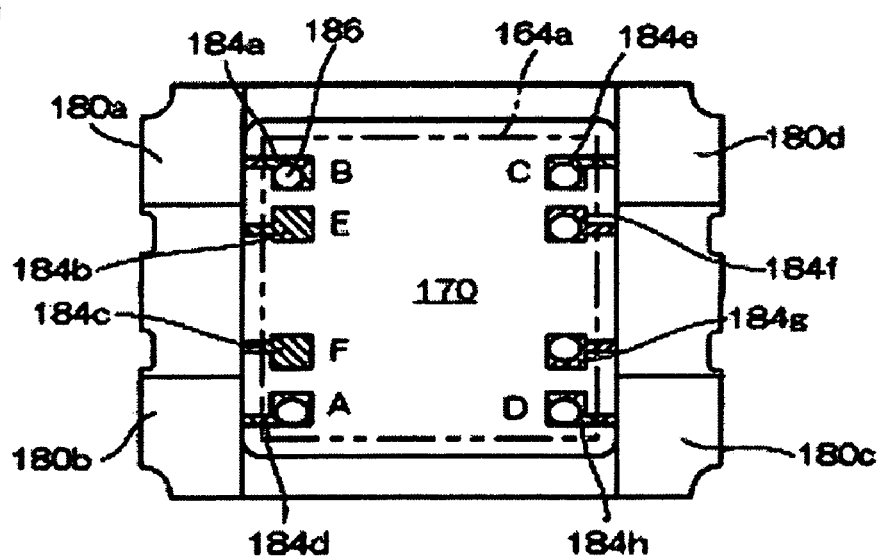

F I G. 17
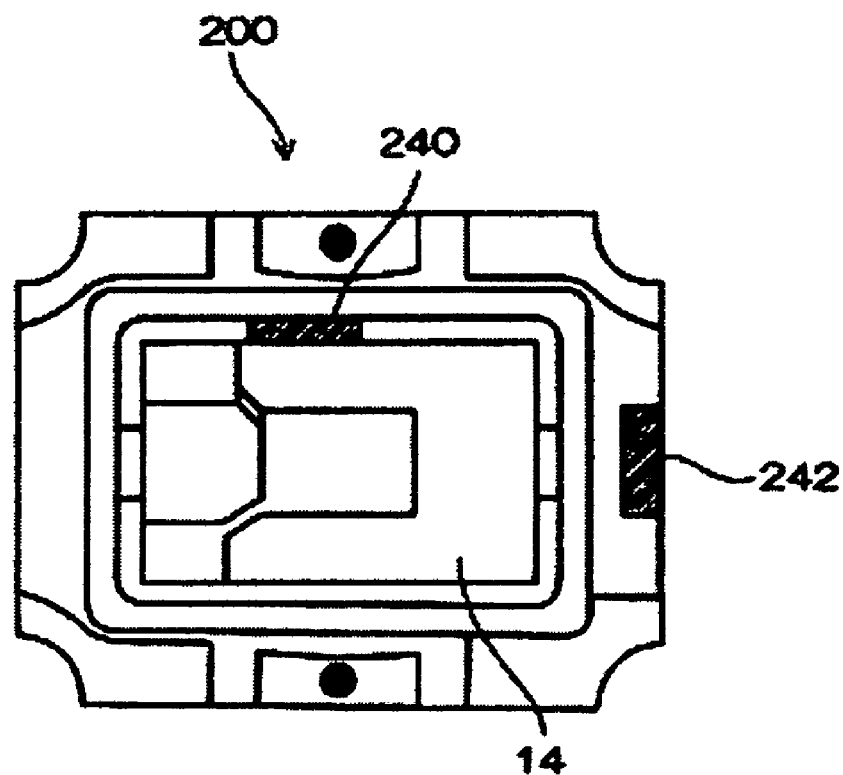
F I G. 18
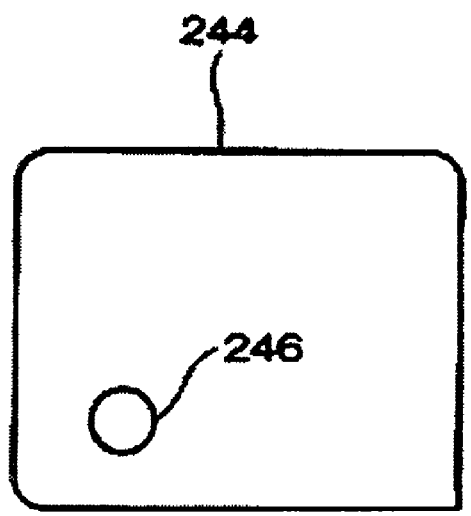

PACKAGE FOR ELECTRONIC COMPONENT AND METHOD OF MANUFACTURING PIEZOELECTRIC DEVICE

BACKGROUND OF INVENTION

1. Filed of Invention

Aspects of the invention can relate to a package for an electronic component, and especially to a package for an electronic component having a plurality of mounting electrodes for connecting to connection electrodes of the component itself contained in the package and to a method of manufacturing a piezoelectric device.

2. Description of Related Art

Related art piezoelectric devices, such as quartz resonators or quartz oscillators, as electronic components are contained in surface-mount type packages having main bodies formed with ceramic to have box-shapes in order to meet requirements of smaller-sized or thinner electronic instruments. The piezoelectric devices having such box-shaped packages are often handled with wrong orientations in, for example, right and left direction. And it can be inconvenient that the piezoelectric devices do not normally function when they are mounted with wrong orientations in right and left direction. Therefore, as described in FIGS. 19(1) through 19(3), a related art piezoelectric device can be equipped with a pair of terminal for operating the piezoelectric resonator element, which is disposed on both edges of a diagonal of the bottom of its package body so as to be mounted without any considerations on its mounting orientation. See, for example, Japanese Unexamined Patent Publication No. 11-214950. Note that, FIG. 19(1) shows a plan view with its cover omitted, FIG. 19(2) shows a cross-sectional view thereof with the cover along the A—A line, and FIG. 19(3) shows an arrow view along the B—B line of FIG. 19(2).

In FIGS. 19(1) through 19(3), the piezoelectric resonator 10, which is one of the piezoelectric devices, has a piezoelectric resonator element 14 (a component body) contained inside a package 12. The package 12 is composed of a package body 16 formed like a box with ceramic and a metallic cover 19 for sealing the inside of the package body 16 airtight.

The piezoelectric resonator element 14 can be composed of, for example, a piezoelectric plate element 15, such as an AT-cut quartz plate, excitation electrodes 18a, 18b (the excitation electrode 18b is not shown in the drawings) are provided in the center and on the both sides of the piezoelectric plate element 15. Further, the piezoelectric resonator element 14 can include a pair of connection electrodes 20 (20a, 20b) on one edge thereof in a longitudinal direction. Each of the connection electrodes 20 can be formed continuously on both surfaces of the piezoelectric resonator element 14 and electrically connected to respective one of the excitation electrodes 18a, 18b. And, the excitation electrodes 18 and the connection electrodes 20 are formed symmetrically on the both surfaces of the piezoelectric resonator element 14.

On the bottom of the package body 16, there can be formed a pair of mounting electrodes 22 (22a, 22b) correspondingly to the connection electrodes 20. As shown in FIG. 19(2), these mounting electrodes 22 are provided with the corresponding connection electrodes 20 fixed via electrically conductive adhesive 24 to electrically connect the mounting electrodes 22 with the excitation electrodes 18. Further, the package body 16 can include external terminals 26 (26a through 26d) for connecting to a mounting board not shown at respective corners of the outer surfaces of the bottom.

One mounting electrode 22a in the package 12 is electrically connected to the external terminal 26a via a through hole not shown or the like. Further, the other mounting electrodes 22b can be electrically connected to the external terminal 26c via a connection wiring section 28 shown in FIG. 19(1). Therefore, the pair of electrodes of the piezoelectric resonator element 14 is electrically connected to the external terminals 26a, 26c positioned on a diagonal of the package 12. And, the other pair of external terminals 26b, 26d is connected to the ground of the board and is electrically connected to the cover 19. Thus, the cover 19 can be held in the ground potential to electromagnetically shield the inside of the package 12.

SUMMARY OF INVENTION

As described above, in related art piezoelectric devices, the external terminals provided on both edges of diagonals of the packages are electrically connected to pairs of electrodes formed on the piezoelectric resonator elements so as to be mounted on the boards without considering their orientations in right and left direction. However, in recent years, restrictions in designing have been increased as rapid progress of downsizing of electronic devices. Consequently, piezoelectric devices, even with the same shapes and the same performances, are required to have external terminals used for their operation in different positions such as diagonal positions or adjacent positions along the same sides. Accordingly, manufacturers of piezoelectric devices, in order to cope with customers' requirement, need to manufacture various kinds of piezoelectric devices with the same shapes and the same performance but only with external terminals used for operation provided in different positions.

Further, manufacturers of electronic devices sometimes need to use piezoelectric devices with rather large capacitances for matching with the circuits in case of using piezoelectric devices of the same oscillation frequency. In these cases, capacitors with different capacitances need to be mounted on the boards in related technology, which is inconvenient in view of manufacturing process management. Therefore, it is convenient if capacitances, CI (crystal impedance) values could be changed in piezoelectric devices.

Aspects of the invention address that the positions of the external terminals for connecting to a circuit on a board can easily be changed in accordance with a requirement of a customer. Further, the invention can address that the capacitances of electronic components can easily be varied.

In order to achieve the above advantages, a package for an electronic component according to the invention can be a package for an electronic component accommodating a component body, including mounting electrodes, provided in a predetermined number greater than the number of connecting electrodes of the component body, to which the connecting electrodes are selectively bonded, and a plurality of external terminals formed on a lower surface of the package body, and electrically connected to the mounting electrodes, for bonding with a mounting board. A part of the external terminals can be electrically connected to more than one of the mounting electrodes.

According to the invention thus arranged, since the connecting electrodes of the component body are connected to different mounting electrodes in the package by changing the equipment (mounting) orientation even with the same component to be accommodated in the package, the positions of the external terminals for operating the component body can be changed. Therefore, by changing the mounting orientation of the component body to the package in accordance with the customer requirements or electronic component models to be manufactured, the external terminals to be connected to the circuit of the board can be selected. Therefore, the freedom of electronic component designing is increased, as well as it becomes possible to easily cope with various requirements of the customers with a common package. Further, since the various specifications are dealt with the same package, stock of the packages or the electronic components can be reduced.

Further, an exemplary package for an electronic component according to the invention, a package for electronic component for accommodating the component body provided with a pair of connecting electrodes, can include mounting electrodes each pair of which is provided on respective one of the both sides of the bottom surface of the package body, and that is selected in accordance with rotation of the component body to be bonded with the pair of connecting electrodes, and three external terminals formed on the lower surface of the package body, electrically connected to the pair of mounting electrodes of one side and one of the pair of mounting electrodes of the other side, and isolated from each other. The other of the pair of mounting electrodes of the other side can be electrically connected to either one of the pair of electrodes of the one side.

The invention thus arranged, by rotating the component body to change the mounting orientation, the mounting electrodes to which the connecting electrodes of the component body are bonded can be selected. And, by selecting the mounting electrodes to bonding thereto a pair of connecting electrodes of the component body, a pair of connecting terminals can be electrically connected to a pair of external terminals positioned at the ends of a diagonal or adjacent to each other. Therefore, various specifications required by the customers can easily be dealt with, the number of components need to be stocked can be reduced, thus simplifying the management.

Further, a package for an electronic component according to the invention, a package for electronic component for accommodating the component body provided with a pair of connecting electrodes, can include mounting electrodes each pair of which is provided on respective one of the diagonals of the bottom surface of the package body, and that is selected in accordance with rotation of the component body to be bonded with the pair of connecting electrodes, and three external terminals formed on the lower surface of the package body, electrically connected to the pair of mounting electrodes of one side and one of the pair of mounting electrodes of the other side, and isolated from each other. The other of the pair of mounting electrodes of the other side can be electrically connected to either one of the pair of electrodes of the one side.

The invention thus arranged, by rotating the component body to change the mounting orientation, the mounting electrodes to which the connecting electrodes of the component body are bonded can be selected. And, by selecting the mounting electrodes to bonding thereto a pair of connecting electrodes of the component body, a pair of connecting terminals can be electrically connected to a pair of external terminals positioned at the ends of a diagonal or adjacent to each other. Therefore, various specifications required by the customers can easily be dealt with, the number of components need to be stocked can be reduced, thus simplifying the management.

Further, a package for an electronic component according to the invention, a package for an electronic component for accommodating the component body, can include mounting electrodes, provided as many as a predetermined number greater than the number of connecting electrodes of the component body, to which the connecting electrodes are selectively bonded, and a plurality of external terminals formed on a lower surface of the package body, and electrically connected to the mounting electrodes, for bonding with a mounting board. The plurality of external terminals can be formed asymmetrically about any pivots.

According to the invention thus arranged, by changing the orientation of the component body when accommodating to the package, the connecting electrodes of the component body can electrically be connected to the different mounting electrodes of the package to change the external terminals for operating the component body. In addition, since the plurality of external terminals is not provided at rotationally symmetric positions, the external terminals in the positions corresponding to the customer requirements can easily be selected. Therefore, the same advantages described above can be provided.

Further, aspects of the invention can provide a package for an electronic component according to the invention, wherein at least a part of the plurality of mounting electrodes has different area from the area of another of the mounting electrodes. Further, a package for an electronic component according to the invention, further including an extension pattern electrically connected to at least one of the plurality of mounting electrodes.

According to the invention thus arranged, by changing the orientation of the component body when accommodating to the package, the connecting electrodes of the component body can electrically be connected to the mounting electrodes of the package having different area to change the parasitic capacitance (stray capacitance) added to the component body. Therefore, by accommodating in the package with different orientation in accordance with specifications required by the customers or models, the capacitances of the electronic components can substantially be varied.

Further, a package for an electronic component according to the invention, a package for an electronic component for accommodating the component body, can include mounting electrodes, provided as many as a predetermined number greater than the number of connecting electrodes of a first component body, to which the connecting electrodes are selectively bonded, a plurality inner terminals electrically connected to electrodes of a second component body, and a plurality of external terminals formed on a lower surface of the package body, and electrically connected to a part of the inner terminals, for bonding with a mounting board. Each of the plurality of mounting electrodes can be electrically connected to corresponding one of the inner terminals.

According to the invention thus arranged, if the positions of the mounting electrodes for bonding with the first component body need to be changed because the specification of the second component body is different, it can easily be dealt with by only selecting the mounting electrodes. And, in this case, the package comprises a separator section, and the mounting electrodes can be arranged to be formed on one side of the separator section, while the inner terminals can be arranged to be formed on the other side of the separator section.

Further, a package for an electronic component according to the invention, a package for an electronic component for accommodating the component body, can include mounting electrodes, provided as many as a predetermined number greater than the number of connecting electrodes of a first component body, to which the connecting electrodes are selectively bonded, a plurality external terminals, provided on a lower surface of the package body, for bonding with a mounting board, and an upper terminal, provided on a upper surface of the package body, to which an electrode of a second component body disposed above the first component body is electrically connected. A part of the plurality of mounting electrodes can be connected to the external terminal while another part thereof can be electrically connected to the upper terminal, a part of the upper terminals is electrically connected to corresponding one of the external terminals. The package for an electronic component thus arranged, if, for example, the piezoelectric resonator element is used as the first component body, the package can be used for forming the piezoelectric resonator and for piezoelectric oscillator only by changing the mounting orientation of the piezoelectric resonator element.

Further, an exemplary package for an electronic component according to the invention, a package for an electronic component for accommodating the component body, can include a plurality of mounting electrodes, provided to a package body as many as a predetermined number greater than the number of connecting electrodes of the component body, and which is selected in accordance with rotation of the component body to be bonded with connecting electrodes, and a plurality of external terminals formed on a lower surface of the package body, and electrically connected to the mounting electrodes, for bonding with a mounting board. According to the present invention thus arranged, by rotating the component body to select the mounting orientation and then bonding the connecting electrodes provided to the component body with the mounting electrodes, the connecting electrodes can electrically be connected to the different external terminals. Therefore, the positions of the external terminals (mounting terminals) can be changed only by selecting the mounting orientation of the component body in the same package, thus easily dealing with various specifications. Note that a part of the external terminals can be electrically connected to more than one of the mounting electrodes.

Further, a method of manufacturing a piezoelectric device according to the present invention is a method of manufacturing a piezoelectric device using any of the packages for an electronic component described above, comprising the step of selecting the mounting electrodes in accordance with a required specification to bond the connecting electrodes of the piezoelectric resonator element therewith. Thus, the advantages described above can be obtained.

BRIEF DESCRIPTION OF THE DRAWINGS

The invention will be described with reference to the accompanying drawings, wherein like numerals reference like elements, and wherein:

FIG. 5 is a view showing a piezoelectric resonator element provided with a pair of connecting electrodes formed at the ends of a diagonal;

FIG. 6 is a view showing a piezoelectric resonator element provided with a pair of connecting electrodes formed along a longitudinal side;

FIGS. 7(1) and 7(2) are views for explaining a base sheet according to a second exemplary embodiment;

FIG. 10 is a view showing another example of a mounting method of a piezoelectric resonator element in a fourth exemplary embodiment;

FIG. 12 is a view showing another example of a mounting method of a piezoelectric resonator element in a fifth exemplary embodiment;

FIGS. 14(1) through 14(3) are views showing another example of a mounting method of a piezoelectric resonator element according to a sixth exemplary embodiment;

FIG. 17 is a view for explaining a pattern for confirming a mounting orientation;

FIG. 18 is a view illustrating an example of a cover used for confirming a mounting orientation.

DETAILED DESCRIPTION OF PREFERRED EMBODIMENTS

Figure 1:
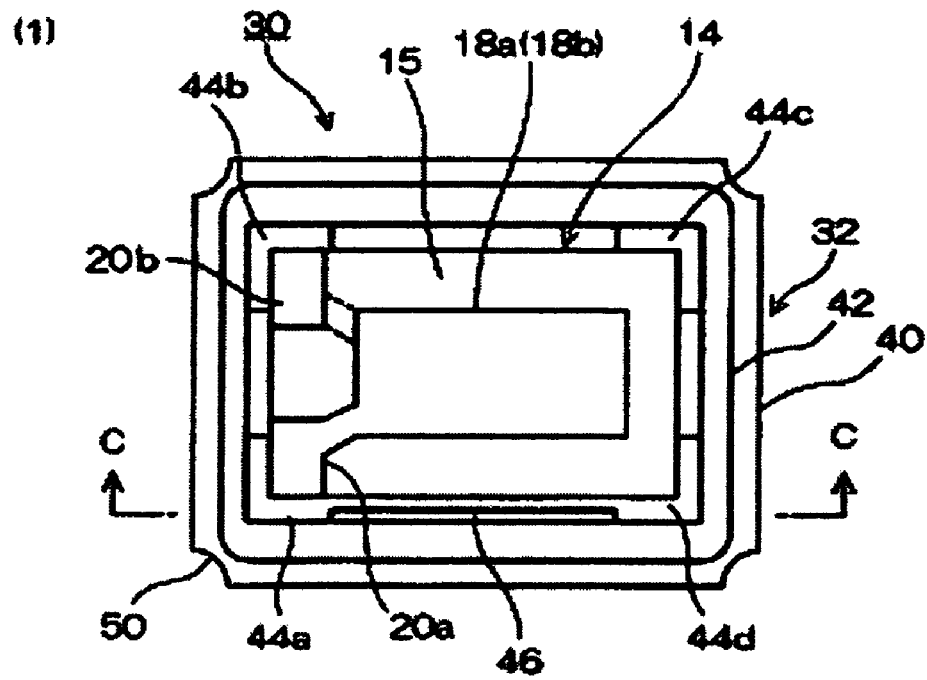
FIGS. 1(1) and 1(2) are views for explaining a first exemplary embodiment of the present invention.
Figure 1:
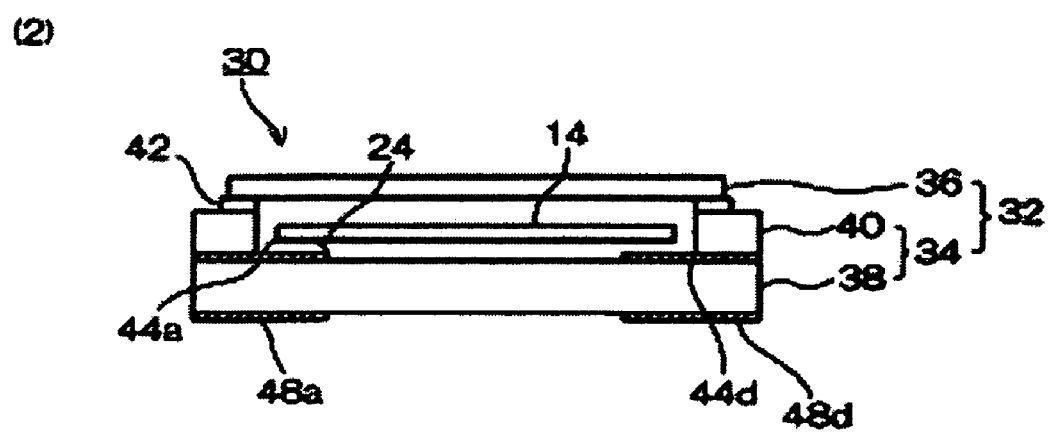

Exemplary embodiments of an electronic component package and a method of manufacturing a piezoelectric device will be described in detail with reference to the accompanying drawings. Note that elements corresponding to those described in the background section are denoted with the same reference numerals and the description therefor will be omitted.

FIGS. 1(1) and 1(2) explanatorily show an exemplary electronic component using an electronic component package according to a first embodiment of the present invention, where FIG. 1(1) is a plan view without the cover and FIG. 1(2) is a cross-sectional view along the C—C line in FIG. 1(1) with the cover.

In FIGS. 1(1) and 1(2), the piezoelectric resonator 30, which is one of the piezoelectric devices, has the piezoelectric resonator element 14, a component body, contained inside the package 32, as shown in FIG. 1(2). A package 32 can include a package body 34 made of ceramic and a cover 36. The package body 34 is formed of a base sheet 38 shaped like a plate and a frame sheet 40 shaped like a frame stacked and then baked. And, in the embodiment, the cover 36 is made of metal, such as Kovar™, and can be bonded on the upper surface of the frame sheet 40 via seam ring 42 by seam welding to seal the inside of the package 32 airtight.

On the upper surface of the base sheet 38 defining the bottom of the package body 34, there are formed mounting electrodes 44 (44a through 44d) at the four corners respectively. As shown in FIG. 1(2), these mounting electrodes 44 are arranged to be connected via electrically conductive adhesive 24 to connecting electrodes 20 provided to the piezoelectric resonator element 14, and are electrically connected to the excitation electrodes 18 via the connecting electrodes 20 when being connected to the connecting electrodes 20. Further, in the embodiment, the mounting electrode 44a and the mounting electrode 44b are connected by a wiring pattern 46.

Figure 3:
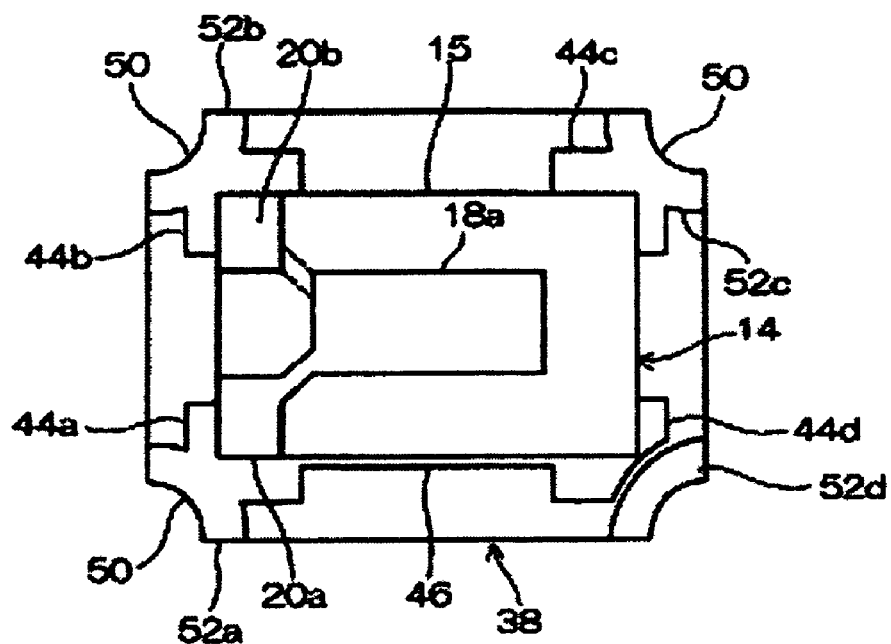
FIGS. 3(1) through 3(3) are views showing an example of a mounting method of a piezoelectric resonator element in a first exemplary embodiment.
Figure 3:
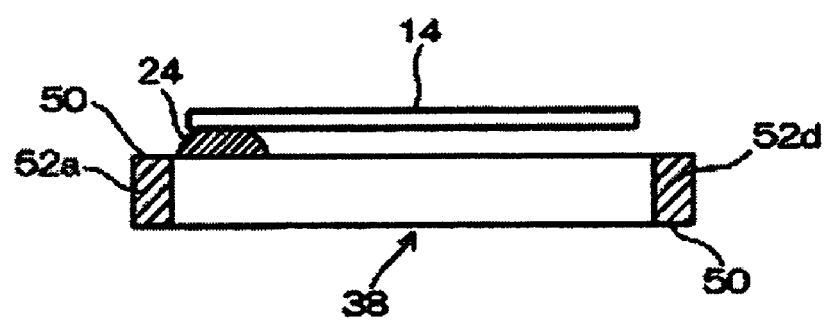
Figure 3:
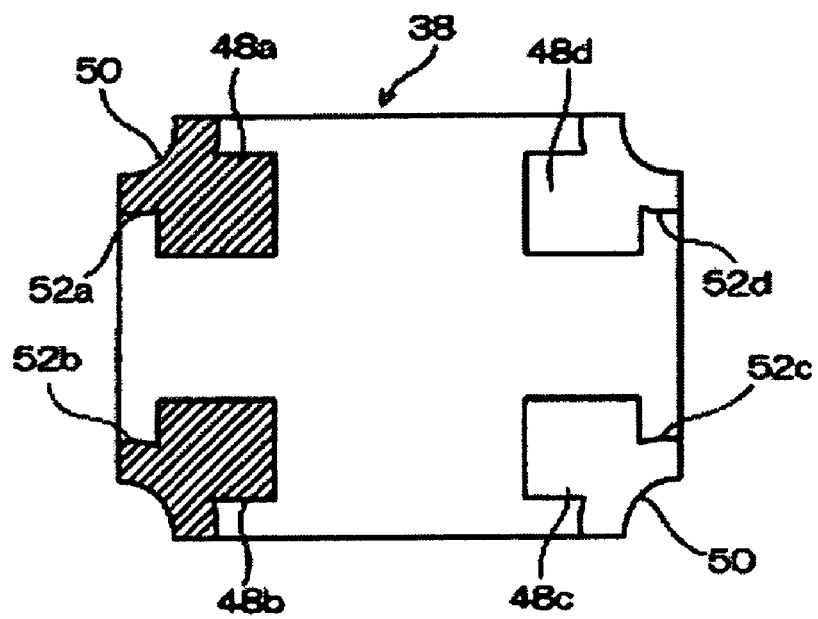

Still further, on the lower surface of the base sheet 38 defining the outer surface of the bottom of the package 32, there are formed external terminals 48 (48a through 48d) at positions corresponding to the mounting electrodes 44 (See FIG. 3(3) for reference.). These external terminals 48 are bonded to a mounting board not shown in the drawings via solder or the like. Further, the external terminals 48a electrically connected to the mounting electrodes 44a through 44c, respectively, as described below. However, the external terminal 48d is not connected to either of the mounting electrodes 44.

The base sheet 38 is formed substantially rectangular with each corner cut to form arc for forming a castellation 50. And, around the castellation 50, there are formed arc-shaped conductive patterns 52 (52a through 52d) made of tungsten or the like. These conductive patterns 52 are formed so as to cover a wall of the castellation 50 and are respectively connected to the external terminals 48 provided on the lower surface of the base sheet 38 (See FIGS. 3(2) and 3(3) for reference.). And, each of the mounting electrodes 44 are formed to be substantially square or substantially rectangle. Further, a pair of the mounting electrodes 44a and 44b of one side is respectively connected to the conductive patterns 52a, 52b corresponding thereto, and is electrically connected to the external terminals 48a, 48b corresponding thereto via the conductive patterns 52. Further, one mounting electrode 44c of a pair of mounting electrodes 44c and 44d of the other side is electrically connected to the external terminals 48c corresponding thereto via the conductive patterns 52c corresponding thereto.

In contrast, the other mounting electrode 44d of the other side is cut in a portion facing to the conductive pattern 52d to form a gap 54 with the conductive pattern 52d. Therefore, the mounting electrode 44d is not connected to the conductive pattern 52d, and accordingly, not connected to the corresponding external terminal 48d. And, the mounting electrode 44d is electrically connected via the wiring pattern 46 to the one mounting electrode 44a of the pair of mounting electrodes 44a, 44b of the one side. Therefore, the external terminal 48a is electrically connected to two of the mounting electrodes 44a, 44d.

Figure 4:
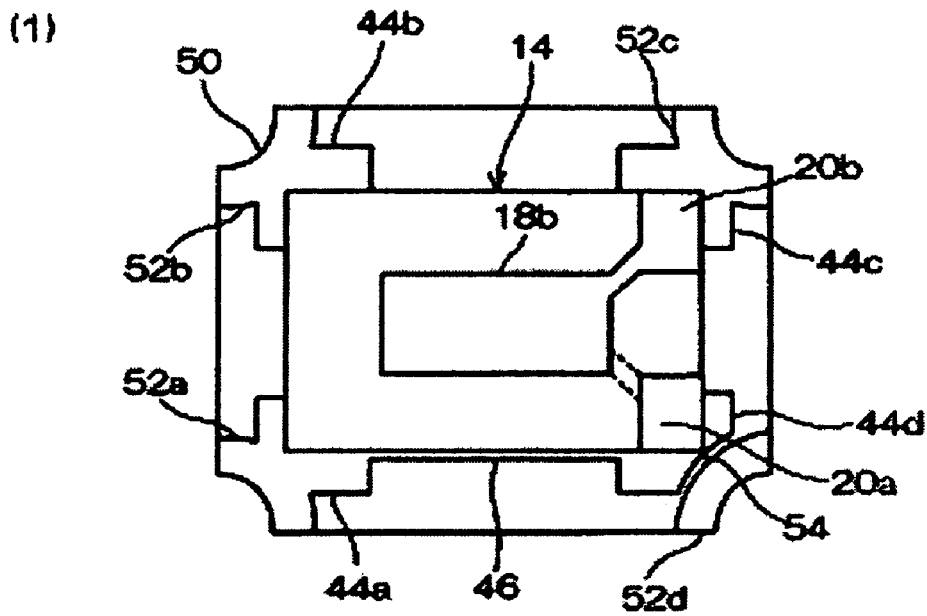
FIGS. 4(1) through 4(3) are views showing another example of a mounting method of a piezoelectric resonator element in a first exemplary embodiment.
Figure 4:
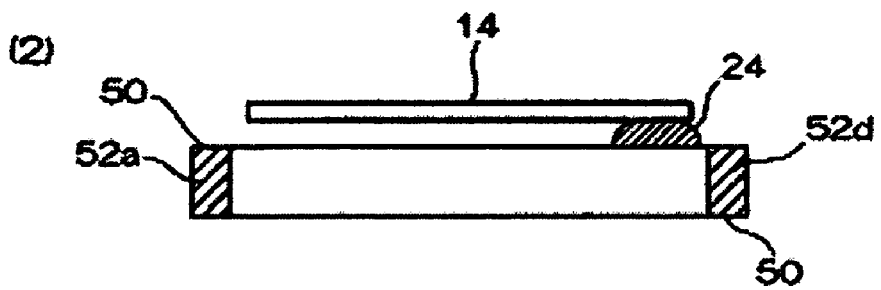
Figure 4:
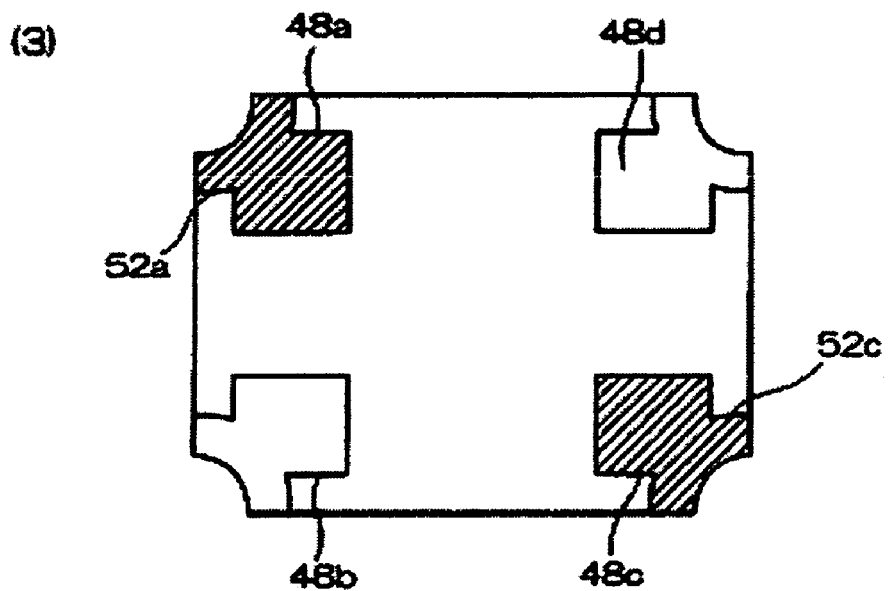

In the package 32 of the first exemplary embodiment thus arranged, as shown in FIGS. 1(1) through 1(2) and 3(1) through 3(3), when the pair of connecting electrodes 20a, 20b of the piezoelectric resonator element 14 is connected to the pair of mounting electrodes 44a, 44b of the one side via the conductive adhesive 24, a pair of external terminals 48a, 48b adjacent to each other functions as the external terminals for operating the piezoelectric resonator element 14 as shown with a shaded portion in FIG. 3(3). In contrast, as shown in FIG. 4(1), when the pair of connecting electrodes 20a, 20b of the piezoelectric resonator element 14 is connected to the pair of mounting electrodes 44c, 44d of the other side via the conductive adhesive 24, the mounting electrode 44c is electrically connected to the external terminal 48c while the mounting electrode 44d is electrically connected to the external terminals 48a. Therefore, when the pair of connecting electrodes 20 of the piezoelectric resonator element 14 is bonded to the mounting electrodes 44c, 44d, as shown in FIG. 4(1), a pair of external terminals 48a, 48c in a diagonal relationship acts as the external terminals for operating the piezoelectric resonator element 14 as shown in FIG. 4(3).

Note that, although in the embodiment, the package body 34 can be made of ceramic, it can be made of resin or metal. And, if the package body 34 is made of metal, the mounting electrodes 44, the wiring pattern 46, and the external terminals 48 are formed on the package body 34 with insulating member (e.g., glass) intervening therebetween to be insulated from the package body 34.

As described above, in the first exemplary embodiment, a pair of external terminals 48 for operating the piezoelectric resonator element 30 can be set to the diagonal positions or the adjacent positions in the same side only by rotating the piezoelectric resonator element 14 to change orientations of mounting to the package 32 and selecting the mounting electrodes to which the piezoelectric resonator element 14 is connected. Therefore, it is easy to cope with characteristic requirements of the customers or models of piezoelectric resonators to be manufactured only by changing the bonding (mounting) orientation of the piezoelectric resonator element 14, thus enhancing the freedom of designing as well as reducing stock.

Figure 2:
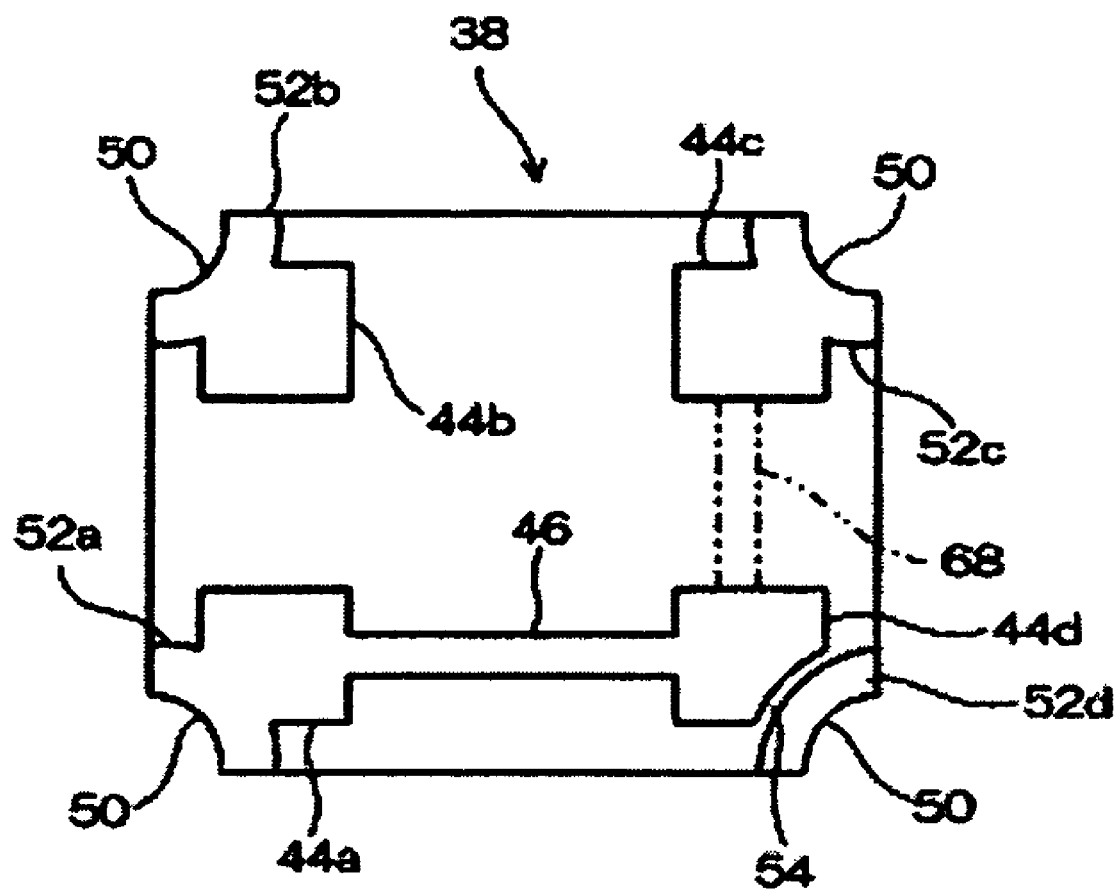
FIG. 2 is a top view of a base sheet of a first exemplary embodiment.

FIGS. 5 and 6 show a modified example of a piezoelectric resonator element. The piezoelectric resonator element 60 shown in FIG. 5 is provided with a pair of connecting electrodes 62 (62a, 62b) disposed at both ends of a diagonal of the piezoelectric plate element 15 formed like a rectangle. When the piezoelectric resonator element 60 thus configured is bonded to, for example, the base sheet 38, shown in FIG. 2 in the orientation shown in FIG. 5, the connecting electrode 62a is bonded to the mounting electrode 44a and the connecting electrode 62b is bonded to the mounting electrode 44c. Therefore, a pair of external terminals 48a, 48c positioned at respective ends of a diagonal functions as a pair of external terminals for operating the piezoelectric resonator. Further, when the connecting electrodes 62a, 62b of the piezoelectric resonator element 60 are bonded to the mounting electrodes 44b, 44d, the external terminals 48a, 48b adjacent to each other function as the pair of electrodes for operating the piezoelectric resonator.

A piezoelectric resonator element 64 shown in FIG. 6 is provided with a pair of connecting electrodes 66a, 66b formed at both ends of a side in the longitudinal direction. In case the piezoelectric resonator element 64 is used, as illustrated with a chain double-dashed line in FIG. 2, for example, the mounting electrodes 44c and 44d are electrically connected by a wiring pattern 68 while the electrical connection between the mounting electrodes 44a and 44d is cut. Thus, when the connecting electrode 66a is connected to the mounting electrode 44a and the connecting electrode 66d is connected to the mounting electrode 44d, a pair of external terminals 48a, 48c functions as the electrodes for operating the piezoelectric resonator. And, when the connecting electrodes 66a, 66b are connected to the mounting electrodes 44b, 44c in the opposite side, a pair of external terminals 48b, 48c functions as the electrodes for operating the piezoelectric resonator.

FIGS. 7(1) and 7(2) show a base sheet forming an electronic component package according to the second embodiment. The base sheet 70 is provided with mounting electrodes 72a through 72d for bonding the piezoelectric resonator element 14 not shown in this drawing at the respective corners on the upper surface. As is the case with the first exemplary embodiment, the pair of mounting electrodes 72a, 72b is connected to the conductive patterns 52a, 52b provided around the castellation 50, and is electrically connected to the external terminals 48a, 48b corresponding thereto via the conductive patterns 52a, 52b.

The other pair of mounting electrodes 72c, 72d is not electrically connected to the external terminals 48c, 48d corresponding thereto because gaps 74, 76 are formed between the pair of mounting electrodes 72c, 72d and the conductive patterns 52c, 52d corresponding thereto. Further, the pair of mounting electrodes 72c, 72d respectively comprises extension patterns 75, 77 extended towards the mounting electrodes 72b, 72a opposite thereto. The leading edges of these extension patterns 75, 77 are connected to via holes 78, 80 provided to the base sheet 70. These via holes 78, 80 can be filled with conductive material, such as tungsten.

Further, as shown in FIG. 7(2), the base sheet 70 is provided with rectangular external terminals 48e, 48f formed between the external terminals 48a and 48d, and between the external terminals 48b and 48c on the lower surface respectively. These external terminals 48e, 48f are provided so as to cover the via holes 78, 80. Accordingly, the external terminals 48e, 48f are electrically connected to the mounting electrodes 72d, 72c. In other words, the base sheet 70 of the exemplary embodiment is provided with the external terminals 48a, 48b, 48c, and 48f respectively connected to the mounting electrodes 72a through 72d at positions not symmetric around the center point of the package body. Therefore, when the pair of connecting electrodes 20 of the piezoelectric resonator element 14 is bonded to the mounting electrodes 72a, 72b, the external terminals 48a, 48b function as the electrodes for operating the piezoelectric resonator, and when the pair of connecting electrodes 20 of the piezoelectric resonator element 14 is bonded to the mounting electrodes 72c, 72d, the external terminals 48e, 48f function as the electrodes for operating the piezoelectric resonator. Accordingly, the positions of the external terminals for operating the piezoelectric resonator can be changed only by bonding the piezoelectric resonator element 14 in a different orientation, thus offering an equivalent advantage to the first embodiment. Note that the external terminals 48c, 48d are connected to the ground by bonded to the mounting board or are held in the electrically floating condition.

Figure 8:
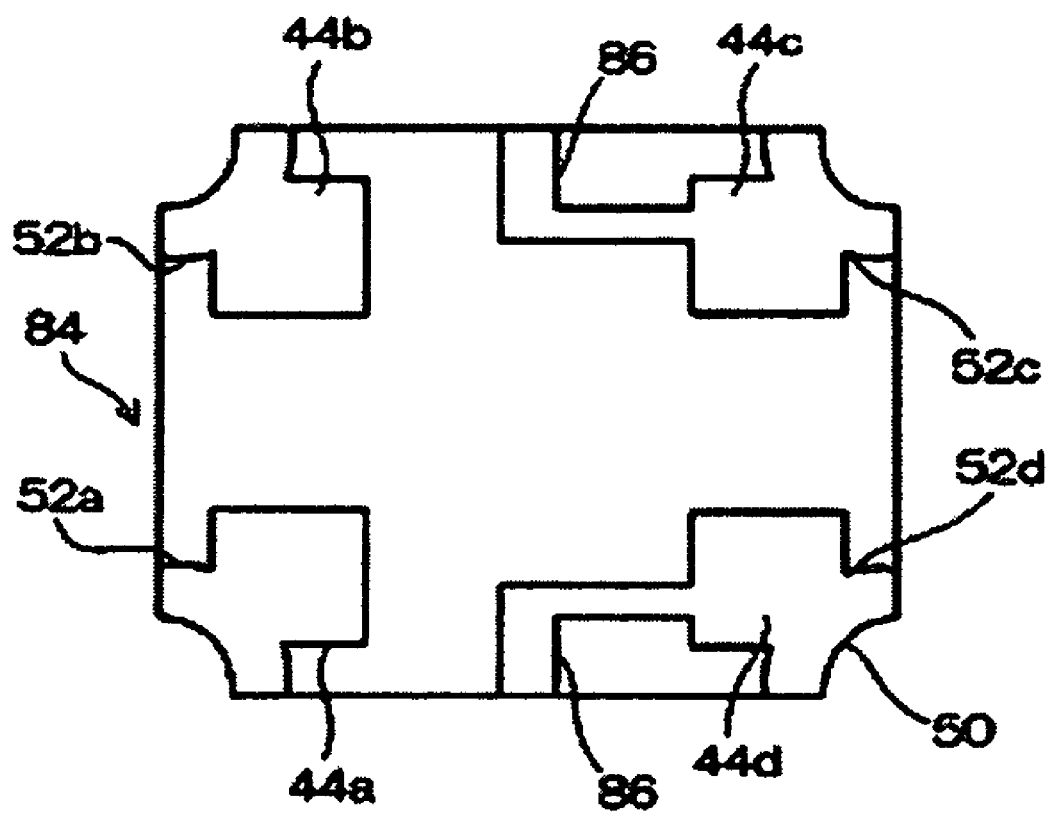
FIG. 8 is a view for explaining a base sheet according to a third exemplary embodiment.

FIG. 8 shows a pattern of a mounting electrode provided on the upper surface of a base sheet according to the third embodiment. The base sheet 84 is provided with the mounting electrodes 44 (44a through 44d) formed at four corners of the base sheet respectively. Further, a pair of mounting electrodes 44c, 44d of one side respectively has angled extension patterns 86 on the sides in which the mounting electrodes 44b, 44a of the other side are facing thereto. In this regard, the pair of mounting electrodes 44c, 44d has areas larger than the other pair of mounting electrodes 44b, 44a by an area corresponding to the extension pattern 86. And, these mounting electrodes 44 are connected to the conductive patterns 52 corresponding thereto, and are electrically connected via the conductive pattern 52 to the external terminals 48 corresponding thereto not shown in this drawing. Note that each of the external terminals 48a through 48d is electrically isolated from each other.

Therefore, in case of the base sheet 84, when the pair of connecting electrodes 20 of the piezoelectric resonator element 14 is bonded to the mounting electrodes 44a, 44b, the external terminals 48a, 48b function as the electrodes for operating the piezoelectric resonator, and when the pair of connecting electrodes 20 is bonded to the mounting electrodes 44c, 44d, the external terminals 48c, 48d function as the electrodes for operating the piezoelectric resonator. And, the mounting electrodes 44a, 44b have different areas from the mounting electrodes 44c, 44d. Therefore, by changing the connecting positions of the connecting electrodes 20 and the mounting electrodes 44, the parasitic capacitance of the piezoelectric resonator can be varied. Thus, when the capacitance needs to be increased for the sake of, for example, matching with a circuit of a mounting board, it is enough to bond the piezoelectric resonator element 14 to the mounting electrodes 44c, 44d. The capacitance can substantially be varied in accordance with the mounting orientation of the piezoelectric resonator element 14 to the package.

Figure 9:
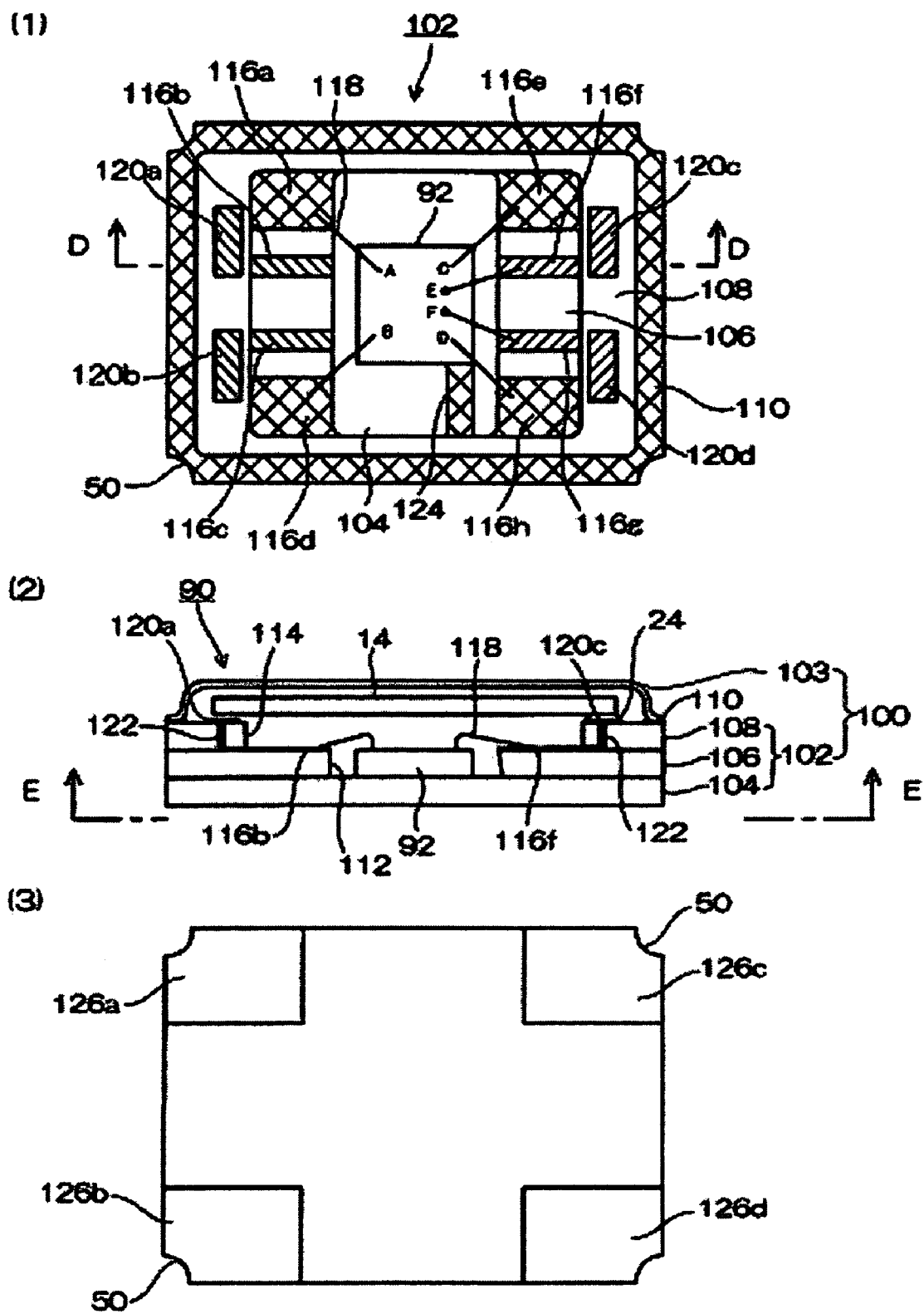
FIGS. 9(1) through 9(3) are views for explaining a piezoelectric oscillator according to a fourth exemplary embodiment.

FIGS. 9(1) through 9(3) and 10 are views for explaining a piezoelectric oscillator, the electronic component according to the fourth embodiment. Here, FIG. 9(1) is a plan view showing a package body with an integrated circuit (IC) mounted thereto, FIG. 9(2) is a cross-sectional view of an assembly of the piezoelectric oscillator along the D—D line in FIG. 9(1), and FIG. 9(3) is an arrow view of the piezoelectric oscillator along the E—E line in FIG. 9(2). Further, FIG. 10 is a view corresponding to FIG. 9(1).

As shown in FIG. 9(2), the piezoelectric oscillator 90 can be provided with the piezoelectric resonator element 14 as a first component body, and an integrated circuit 92 as a second component body encapsulated in a package 100. The package 100 is composed of a package body 102 and a cover 103. The package body 102 has a three-layered structure formed by stacking a base sheet made of ceramic, a first frame sheet 106, and a second frame sheet 108. And, the cover 103 is made of metal, such as kovar™, and bonded on the upper surface of the second frame sheet 108 via a bonding material 110 such as a silver brazing alloy.

The first frame sheet 106 is provided with an opening 112 vertically passing therethrough to form a space for mounting the integrated circuit 92. Further, the second frame sheet 108 is provided with an opening 114 larger than the opening 112 of the first frame sheet 106 to expose a part of the upper surface of the first frame sheet 106. As shown in FIG. 9(1), in the exposed part of the first frame sheet 106 there is formed a plurality of inner terminals 116 (116a through 116h). These inner terminals 116 are electrically connected to terminals (electrodes) of the integrated circuit 92 via bonding wires 118 made of gold or the like. Further, on the upper surface of the second frame sheet 108, there are formed mounting electrodes 120 (120a through 120d) for bonding the connecting electrodes 20 of the piezoelectric resonator element 14. And, each of the mounting electrodes 120 can be electrically connected to corresponding one of the inner terminals 116.

That is, as shown in FIG. 9(2), the mounting electrode 120a is electrically connected to the inner terminal 116b corresponding thereto via the conductive material with which the via hole formed in the second frame sheet 108 is filled. Further, in the same manner, other mounting electrodes 120b, 120c, and 120d are respectively connected to the inner terminals 116c, 116f, and 116g corresponding thereto via the conductive materials in the via holes 112.

On the upper surface of the base sheet 104, there can be formed an index mark 124 functions as a marker for a mounting orientation of the integrated circuit 92 or the piezoelectric vibration element 14 in the part exposed from the opening 112 of the first frame sheet 106. Further, as shown in FIG. 9(3), the base sheet 104 is provided with external electrodes 126 (126a through 126d) at the four corners of the lower surface. The external electrode 126a is electrically connected to the inner terminal 116d via the conductive pattern provided on the wall of the castellation 50 or the via hole which is formed in the first frame sheet 106 but not shown in the drawings. Further, in the same manner, the external terminals 126b, 126c, and 126d are electrically connected to the inner terminals 116a, 116h, and 116e corresponding thereto.

In the fourth exemplary embodiment thus arranged, as shown in FIG. 9(1), if the terminals E, F of the integrated circuit 92 which is to be electrically connected to the piezoelectric resonator element 14 are positioned right, the pair of connecting electrodes 20 of the piezoelectric resonator element 14 is connected to the mounting electrodes 120c, 120d with the conductive adhesive 24 as shown in FIG. 9(2). In contrast, as shown in FIG. 10, if the functions of the terminals at the four corners of the integrated circuit 92a are equivalent to those of the integrated circuit 92 shown in FIG. 9(1), and the terminals E, F to be electrically connected to the piezoelectric resonator element 14 are positioned left, the pair of connecting electrodes 20 of the piezoelectric resonator element 14 is bonded to the mounting electrodes 120a, 120b. Accordingly, even if an integrated circuit of a different specification is used, it can be dealt with only by changing the mounting orientation of the piezoelectric resonator element 14.

Figure 11:
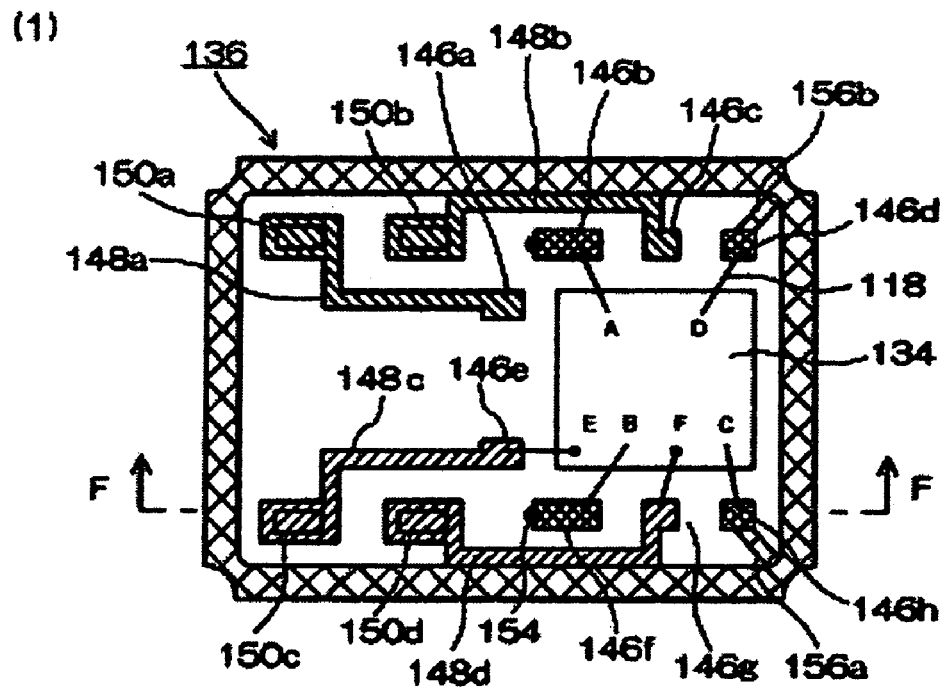
FIGS. 11(1) through 11(3) are views for explaining a piezoelectric oscillator according to a fifth exemplary embodiment.
Figure 11:
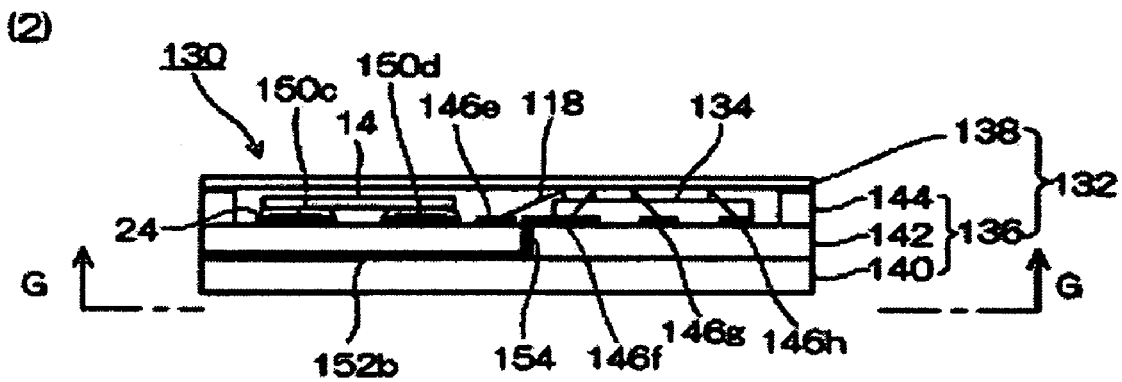
Figure 11:
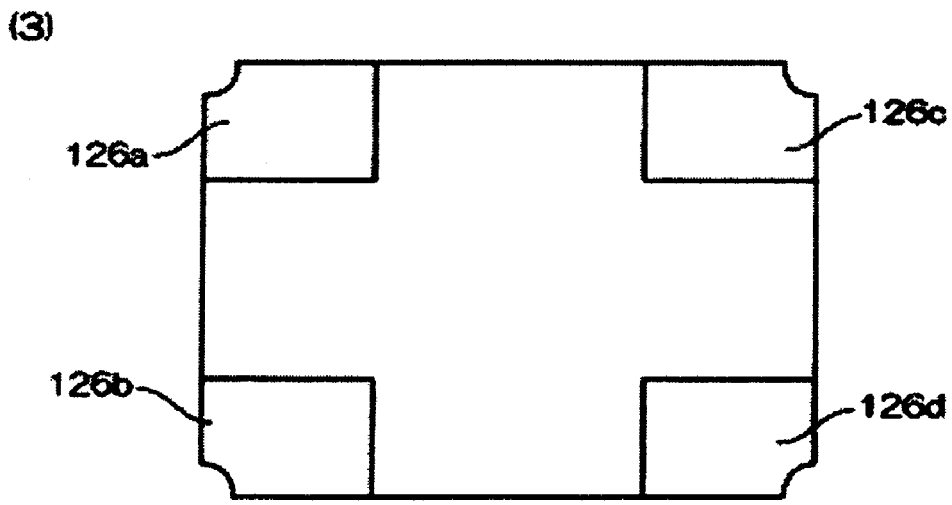

FIGS. 11(1) through 11(3) and 12 are views for explaining a piezoelectric oscillator according to the fifth exemplary embodiment. Here, FIG. 11(1) is a plan view showing a package body with an integrated circuit (IC) mounted thereto, FIG. 11(2) is a cross-sectional view of an assembly of the piezoelectric oscillator along the F—F line in FIG. 11(1), and FIG. 11(3) is an arrow view of the piezoelectric oscillator along the G—G line in FIG. 11(2). Further, FIG. 12 is a view corresponding to FIG. 11(1).

As shown in FIG. 11(2), the piezoelectric oscillator 130 according to the embodiment can be composed of an integrated circuit 134 and the piezoelectric resonator element 14 encapsulated in a package 132. The package 132 is composed of a package body 136 made of ceramic and a cover 138 bonded to the upper surface of the package body 136. The package body 136 is formed by stacking a first base sheet 140 shaped like a plate, a second base sheet 142 shaped like a plate, and a frame sheet 144 shaped like a frame.

As shown in FIG. 11(1), on the upper surface of the second frame sheet 142, there is formed a plurality of inner terminals 146 (146a through 146h). These inner terminals 146 are electrically connected to terminals of the integrated circuit 134 via bonding wires 118. Further, the inner terminals 146a, 146c, 146e, and 146g are formed integrally with wiring patterns 148 (148a through 148d) respectively. And, a land is formed at an end of each of the patterns 148 on which one of mounting electrodes 150 (150a through 150d) for bonding the piezoelectric resonator element 14 is provided. Further, on the upper surface of the first base sheet 140, there is formed a pair of wiring patterns 152a, 152b (The wiring 152a is not shown.).

One end of one wiring pattern 152b is positioned below the inner terminal 146f, and the other end thereof is connected through the wall of the castellation 50 to the external terminal 126a provided on the lower surface of the first base sheet 140. And, the wiring pattern 152b is electrically connected to the inner terminal 146f via the conductive material filled in a via hole 154 provided to the second base sheet 142. Therefore, the external terminal 126a is electrically connected to the inner terminal 146f through the wiring pattern 152b and the via hole 154. Further, one end of the other wiring pattern 152a is positioned below the inner terminal 146b, and the other end thereof is connected to the external terminal 126b through the wall of the castellation 50. Therefore, the external terminal 126b is electrically connected to the inner terminal 146b through the wiring pattern 152a. Still further, the external terminals 126c, 126d are electrically connected to the inner terminals 146h, 146d via the wiring patterns 156a, 156b reaching to the inner terminals 146h, 146d through the wall of the castellation 50, respectively.

In the fifth exemplary embodiment thus arranged, as shown in FIG. 11(1), if the terminals E, F of the integrated circuit 134 which is to be electrically connected to the piezoelectric resonator element 14 are positioned lower as illustrated in the drawing, the pair of connecting electrodes 20 of the piezoelectric resonator element 14 is connected to the mounting electrodes 150c, 150d with the conductive adhesive 24 as shown in FIG. 11(2). In contrast, as shown in FIG. 12, if the functions of the terminals at the four corners of the integrated circuit 134a are equivalent to those of the integrated circuit 134 shown in FIG. 11(1), and the terminals E, F to be electrically connected to the piezoelectric resonator element 14 are positioned upper, the pair of connecting electrodes 20 of the piezoelectric resonator element 14 can be bonded to the mounting electrodes 150a, 150b. Accordingly, even if an integrated circuit of a different specification is used, it can be dealt with only by changing the mounting orientation of the piezoelectric resonator element 14.

Figure 13:
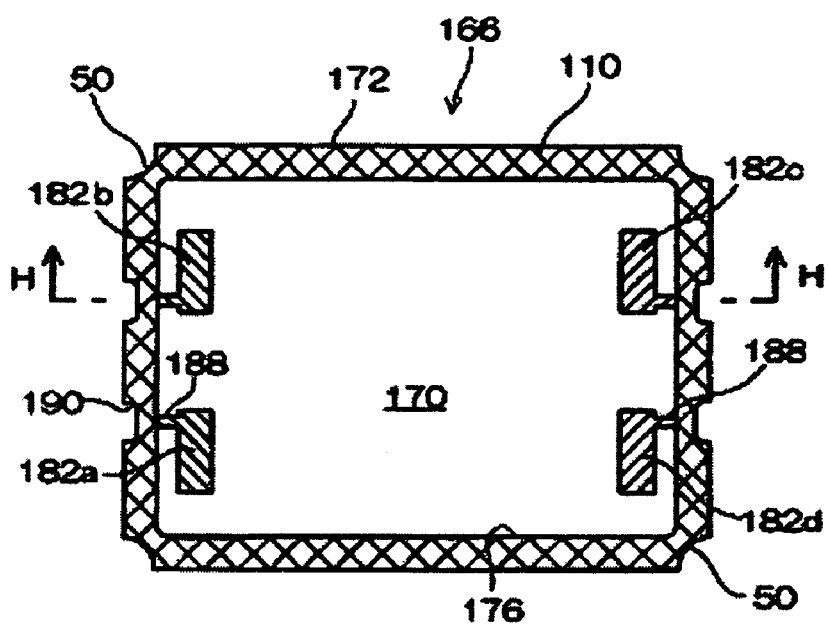
FIGS. 13(1) through 13(3) are views for explaining a piezoelectric oscillator according to a sixth exemplary embodiment.
Figure 13:
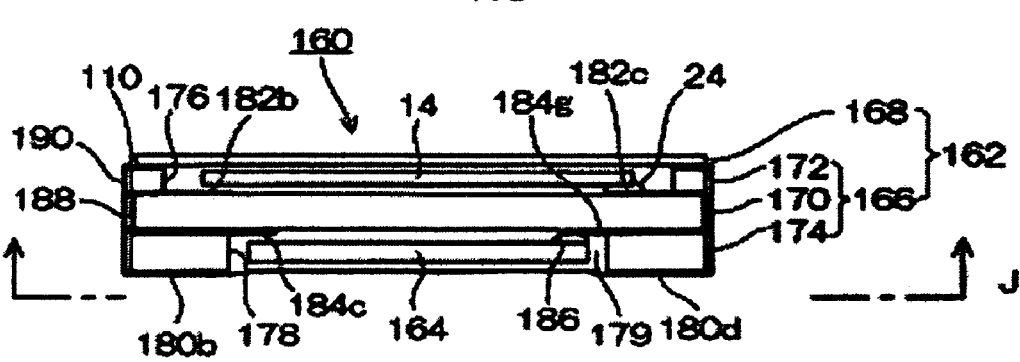
Figure 13:
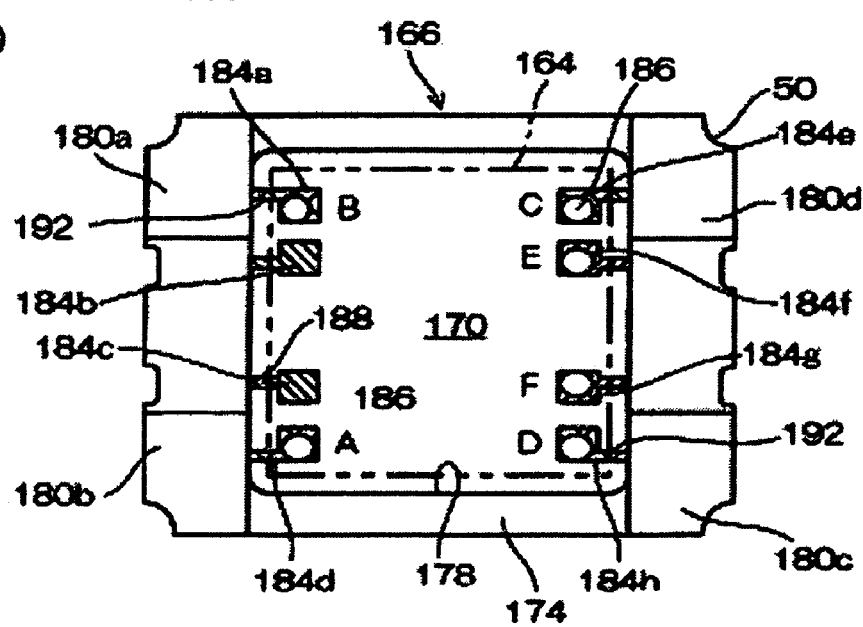

FIGS. 13(1) through 13(3) and 14(1) through 14(3) are views for explaining a piezoelectric oscillator according to the sixth exemplary embodiment. Here, FIG. 13(1) is a plan view of a package body, FIG. 13(2) is a cross-sectional view of a part of an assembly of the piezoelectric oscillator along the H—H line in FIG. 13(1), and FIG. 13(3) is an arrow view along the J—J line of FIG. 13(2). Further, FIG. 14(1) is a view corresponding to FIG. 13(1), FIG. 14(2) is a cross-sectional view of a part of an assembly of the piezoelectric oscillator along the K—K line in FIG. 14(1), and FIG. 14(3) is an arrow view along the L—L line of FIG. 14(2).

As shown in FIG. 13(2), the piezoelectric oscillator 160 according to the sixth embodiment can be composed of the piezoelectric resonator element 14 and an integrated circuit 164 contained in a package 162. The package 162 is equipped with a package body 166 and a cover 168. The package body 166 is composed of a base sheet 170 shaped like a plate and forming a separator section, an upper frame sheet 172 stacked on the upper surface of the base sheet 170, and lower frame sheet 174 provided to the lower surface of the base sheet 170.

The upper frame sheet 172 is shaped like a frame to define an upper cavity 176 for accommodating the piezoelectric resonator element 14 on the upper side of the base sheet 170. Further, on the upper surface of the upper frame sheet 172, there is provided a bonding material 110, such as the silver brazing alloy, through which the cover 168 is bonded airtight. In contrast, the lower frame sheet 174 is formed like a frame for defining a lower cavity 178 for accommodating the integrated circuit 164 on the lower side of the base sheet 170. Further, the lower frame sheet 174 is provided with external terminals 180 (180a through 180d) formed at the four corners of the lower surface thereof.

On the upper surface of the base sheet 170, there are formed two pairs of mounting electrodes 182 (182a through 182*d*) for bonding the piezoelectric resonator element 14. Further, on the lower surface of the base sheet 170, there can be formed inner terminals 184 (184*a* through 184*h*). These inner terminals 184 are bonded with terminals A through F of the integrated circuit 164 via conductive bonding materials 186, such as conductive adhesives or metal bumps. And, the integrated circuit 164 bonded to the inner terminals 184 is sealed by sealing resin 179 with which the lower cavity 178 is filled.

The mounting electrodes 182 formed on the upper surface of the base sheet 170 are electrically connected to the inner terminals 184*b*, 184*c*, 184*f*, and 184*g* positioned in a center portion along the shorter sides of the lower surface of the base sheet 170 via wiring patterns 188, respectively. Namely, as shown in FIG. 13(2), these wiring patterns 188 are formed continuously to the lower surface of the base sheet 170 through the wall of a castellation 190 formed on the side surface of the base sheet 170. Further, the inner terminals 184*a*, 184*d*, 184*e*, and 184*h* formed at the respective corners of the lower cavity 178 are electrically connected to the external terminals 180 corresponding thereto via the conductive patterns 192.

In the sixth exemplary embodiment thus arranged, as shown in FIG. 13(3), if the terminals E, F of the integrated circuit 164 which is to be electrically connected to the piezoelectric resonator element 14 are positioned right as illustrated in the drawing, the pair of connecting electrodes 20 of the piezoelectric resonator element 14 is connected to the mounting electrodes 182*c*, 182*d* with the conductive adhesive 24 as shown in FIG. 13(2). In contrast, as shown in FIG. 14(3), if the functions of the terminals at the four corners of the integrated circuit 164*a* are equivalent to those of the integrated circuit 164 shown in FIG. 13(3), and the terminals E, F to be electrically connected to the piezoelectric resonator element 14 are positioned left, the pair of connecting electrodes 20 of the piezoelectric resonator element 14 is bonded to the mounting electrodes 182*a*, 182*b*. Accordingly, even if an integrated circuit of a different specification is used, it can be dealt with only by changing the mounting orientation of the piezoelectric resonator element 14.

Figure 15:
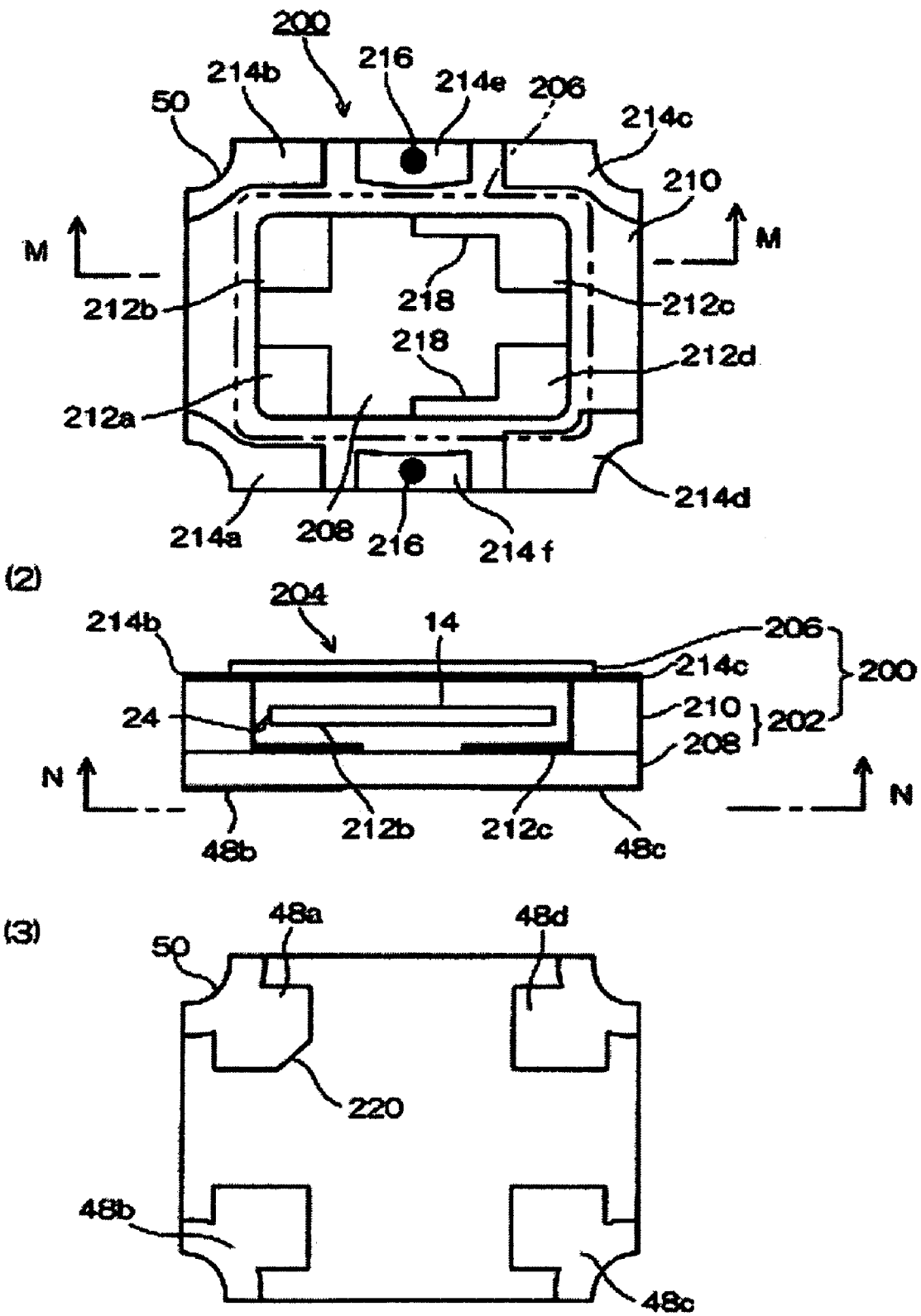
FIGS. 15(1) through 15(3) are views for explaining an electronic component package according to a seventh exemplary embodiment.

FIGS. 15(1) through 15(3), 16(1) and 16(2) are views for explaining a seventh exemplary embodiment. Here, FIG. 15(1) is a plan view of a package according to the seventh exemplary embodiment, FIG. 15(2) is cross-sectional view of an assembly of a piezoelectric resonator along the M—M line in FIG. 15(1), FIG. 15(3) is an arrow view along N—N line in FIG. 15(2). Further, FIG. 16(1) is a plan view showing the package mounting an integrated circuit, FIG. 16(2) is a cross-sectional view showing an assembly of the piezoelectric oscillator along the O—O line in FIG. 16(1).

The package 200 according to the embodiment is arranged to be used for forming a piezoelectric resonator and a piezoelectric oscillator. As shown in FIG. 15(2), the package 200 can be arranged to accommodate the piezoelectric resonator element 14 inside the package body 202 to form the piezoelectric resonator 204. And, the package 200 is arranged to bond a cover 206 on the upper surface of the package body 202 via bonding material to seal the inside of the package body 202 airtight.

The package body 202 is formed by stacking a base sheet 208 made of ceramic and a frame sheet 210 shaped like a frame. On the upper surface of the base sheet 208, as shown in FIG. 15(1), there are formed mounting electrodes 212 (212*a* through 212*d*) at the four corners. A pair of the mounting electrodes 212*a*, 212*b* is electrically connected to the external terminals 48*a*, 48*b* provided on the lower surface of the base sheet 208 via the wall of the castellation 50. However, the other pair of the mounting electrodes 212*c*, 212*d* is not connected to the external terminals 48, but connected electrically to terminals provided on the upper surface of the package body 202 as described below.

On the upper surface of the frame sheet 210 forming the package body 202, there are provided upper terminals 214 (214*a* through 214*f*) at the four corners and the centers of the longitudinal sides thereof. These upper terminals 214 are for electrically connecting to the terminals of the integrated circuit as described below. And, the upper terminals 214*a* through 214*d* provided at the corners are electrically connected to the external terminals 48*a* through 48*d* corresponding thereto provided on the lower surface of the base sheet 208 via the conductive pattern provided on the wall of the corresponding castellation. Further, the upper terminals 214*e*, 214*f* provided at the centers of the longitudinal sides are electrically connected to the mounting electrodes 212*c*, 212*d* through the conductive materials filled in the via holes formed in the frame sheet 210. Namely, the mounting electrodes 212*c*, 212*d* have extension patterns reaching to the bottoms of the via holes 216.

Note that the package 200 according to the exemplary embodiment is provided with a mark for recognizing the mounting orientation. Namely, a predetermined one (e.g., the external terminal 48*a*) of the external terminals 48 formed on the lower surface of the base sheet 208 is provided with a notch 220 to function as the index mark for designating the mounting orientation.

According to the package 200 thus arranged, when forming the piezoelectric resonator 204, as shown in FIG. 15(2), a pair of connecting electrodes 20 of the piezoelectric resonator element 14 is bonded to the mounting electrodes 212*a*, 212*b* via the conductive adhesive 24. In this piezoelectric resonator 204, the pair of external terminals 48*a*, 48*b* functions as the terminals for use of the operation.

Figure 16:
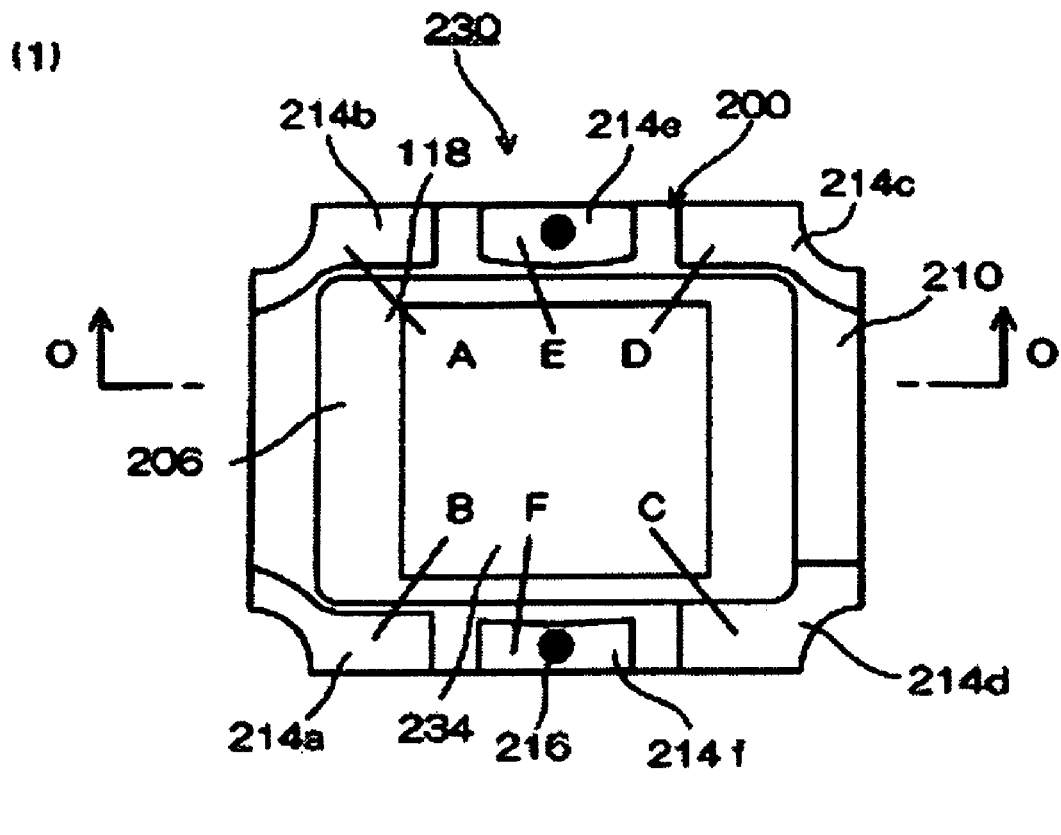
FIG. 16 is a view for explaining a piezoelectric oscillator using a package according to a seventh exemplary embodiment.
Figure 16:
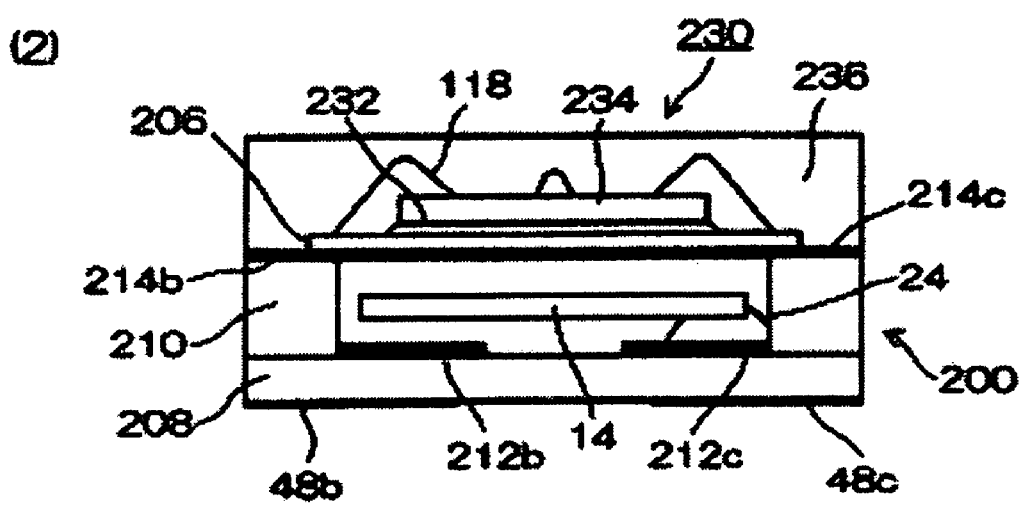
Figure 19:
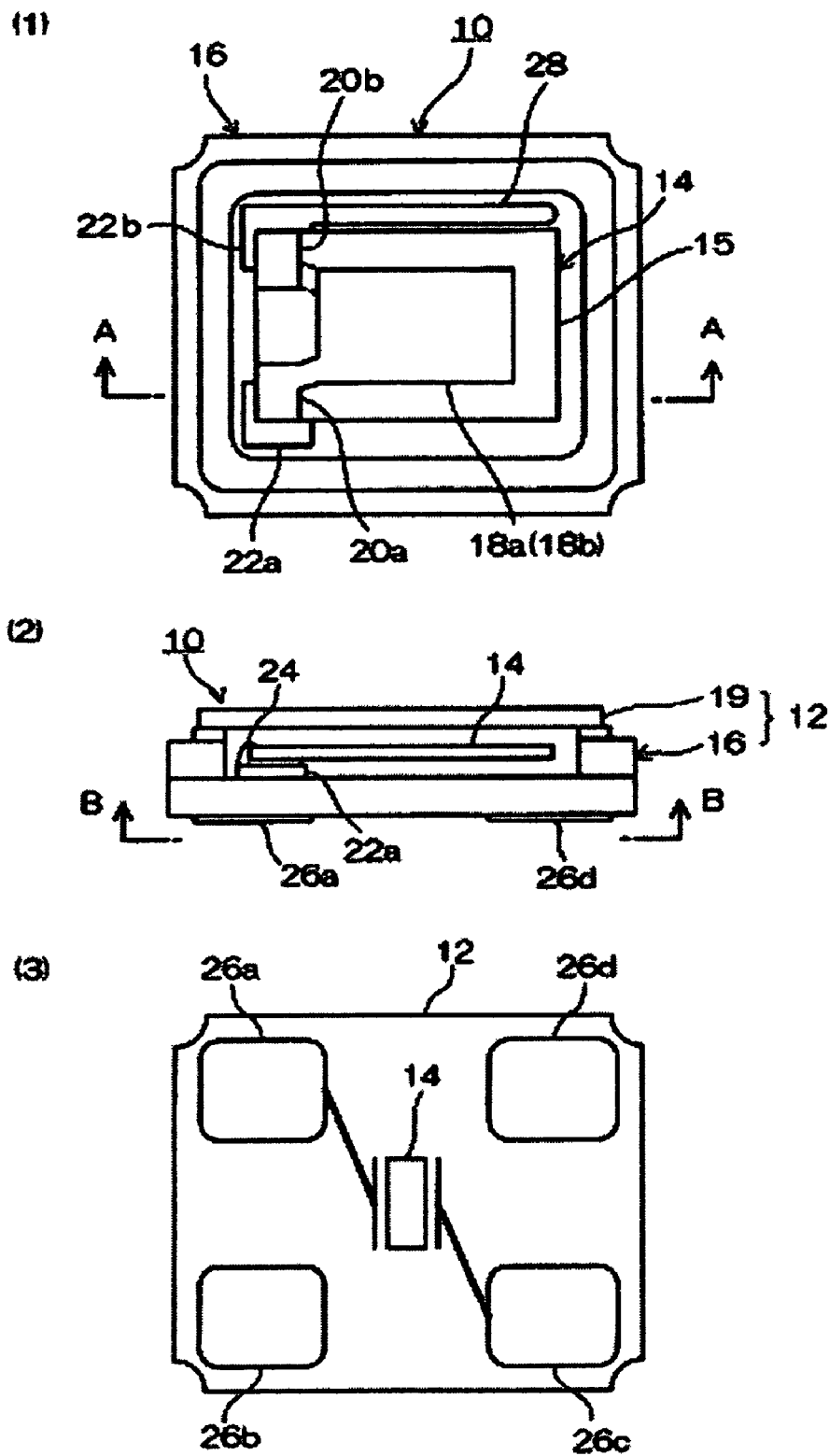
FIGS. 19(1) through 19(3) are views for explaining a conventional electronic component package.

In contrast, as shown in FIGS. 16(1) and 16(2), if the piezoelectric oscillator 230 is formed using the package 200, as shown in FIG. 16(2), a pair of connecting electrodes 20 of the piezoelectric resonator element 14 is bonded to the mounting electrodes 212*c*, 212*d*. Accordingly, the electrodes of the piezoelectric resonator element 14 are electrically connected to the upper terminals 214*e*, 214*f*. And, after the piezoelectric resonator element 14 is mounted inside the package 200, the cover 206 is bonded on the upper surface of the frame sheet 210 to seal the inside of the package 200. Subsequently, as shown in FIG. 16(2), an integrated circuit 234 is bonded on the upper surface of the cover 206 via adhesive 232. And then, the terminals of the integrated circuit 234 and the upper terminals 214 are electrically connected with bonding wires 118, and further, the integrated circuit 234 is sealed with the sealing resin 236 as shown in FIG. 16(2).

As described above, the package 200 of the seventh exemplary embodiment can be used for forming the piezoelectric resonator 204 as well as forming the piezoelectric oscillator 230 by changing the mounting orientation of the piezoelectric resonator element 14.

Note that by bonding the connecting electrodes 20 to the mounting electrodes 212*a*, 212*b*, either of the external terminals 48 are electrically connected to the connecting electrodes 20. In contrast, if the connecting electrodes 20 are bonded to the mounting electrodes 212*a*, 212*b*, the external terminals 48 are electrically connected only to the upper terminals, but not connected electrically to the connecting electrodes 20.

Accordingly, by changing the mounting orientation of the piezoelectric resonator element 14, the same package can be used for two kinds of applications, namely the piezoelectric resonator and the piezoelectric oscillator without exposing any unnecessary terminals on the mounting surface.

Note that, although in the above exemplary embodiments the case in which a part of the external terminal is cut to form the index mark of the mounting orientation with respect to the mounting board is described, patterns 240, 242 for forming the marker can be formed at predetermined portions of the upper surface of the package 200 as shown in FIG. 17. Further, as a cover 244 shown in FIG. 18, the cover can be formed to be an asymmetric shape, or a mark 246 can be provided on a part of the cover 244.

Although, in the above exemplary embodiment, the cases in which the packages are used for forming the piezoelectric devices are described, it can also be used for forming other electronic components, such as semiconductor integrated circuits or capacitors or the like.

Further, while the invention has been described in conjunction with specific embodiments thereof, it is evident that many alternatives, modifications and variations will be apparent to those skilled in the art. Accordingly, preferred embodiments of the invention as set forth herein are intended to be illustrative, not limiting. There are changes that may be made without departing from the spirit and scope of the invention.

What is claimed is:

1. A package for an electronic component that accommodates a component body, comprising:
    a package body;
    mounting electrodes, provided on respective one of both sides of an upper surface of the package body in a predetermined number greater than a number of connecting electrodes of the component body, to which the connecting electrodes are selectively bonded;
    a plurality of external terminals formed on a lower surface of the package body and electrically coupled to the mounting electrodes, the external terminals bonding with a mounting board and being isolated from each other; and
    a part of the external terminals being electrically coupled to more than one of the mounting electrodes.

2. A package for an electronic component that accommodates a component body provided with a pair of connecting electrodes, comprising:
    a package body having a base sheet at a bottom portion;
    mounting electrodes each pair of which is provided on respective one of both sides of an upper surface of the base sheet, and is selected in accordance with rotation of the component body to be bonded with the pair of connecting electrodes that are selectively bonded to the component body;
    three external terminals formed on a lower surface of the package body, electrically coupled to the pair of mounting electrodes of one side and one of the pair of mounting electrodes of the other side, and isolated from each other; and
    the other of the pair of mounting electrodes of the other side being electrically coupled to either one of the pair of electrodes of the one side;
    the external terminals being bonded with a mounting board.

3. A package for an electronic component that accommodates a component body provided with a pair of connecting electrodes, comprising:
    a package body;
    mounting electrodes, each pair of which is provided on respective one of diagonals of a bottom surface of the package body, and is selected in accordance with rotation of the component body to be bonded with the pair of connecting electrodes that are selectively bonded to the component body;
    three external terminals that are formed on a lower surface of the package body, electrically coupled to the pair of mounting electrodes of one side and one of the pair of mounting electrodes of the other side, and isolated from each other; and
    the other of the pair of mounting electrodes of the other side being electrically coupled to either one of the pair of electrodes of the one side;
    the external terminals being bonded with a mounting board.

4. A package for an electronic component that accommodates a component body, comprising:
    a package body having a base sheet at a bottom portion;
    mounting electrodes, provided in a predetermined number greater than a number of connecting electrodes of the component body, to which the connecting electrodes are selectively bonded, the mounting electrodes being mounted on respective one of both sides of an upper surface of the base sheet;
    a plurality of external terminals formed on a lower surface of the package body and electrically coupled to the mounting electrodes, the external terminals bonding with a mounting board and being isolated from each other; and
    the plurality of external terminals being formed asymmetrically about any pivots.

5. The package for an electronic component according to claim 1,
    at least a part of the plurality of mounting electrodes having a different area from an area of another of the mounting electrodes.

6. The package for an electronic component according to claim 5, further comprising:
    an extension pattern electrically coupled to at least one of the plurality of mounting electrodes.

7. A package for an electronic component that accommodates a component body, comprising:
    a package body having a base sheet at a bottom portion;
    mounting electrodes, provided in a predetermined number greater than a number of connecting electrodes of a first component body, to which the connecting electrodes are selectively bonded, the mounting electrodes being mounted on respective one of both sides of an upper surface of the base sheet;
    a plurality inner terminals electrically coupled to electrodes of a second component body;
    a plurality of external terminals formed on a lower surface of the package body and electrically coupled to a part of the inner terminals, the external terminals bonding with a mounting board and being isolated from each other; and
    each of the plurality of mounting electrodes being electrically coupled to corresponding one of the inner terminals.

8. The package for an electronic component according to claim 7, the package body comprising:
    a separator section;
    the mounting electrodes being formed on one side of the separator section; and
    the inner terminals being formed on the other side of the separator section.

9. A package for an electronic component that accommodates the component body, comprising:
a package body having a base sheet at a bottom portion;
mounting electrodes, provided in a predetermined number greater than a number of connecting electrodes of a first component body, to which the connecting electrodes are selectively bonded the mounting electrodes being mounted on an upper surface of the base sheet;
a plurality external terminals, provided on a lower surface of the package body, that bond with a mounting board;
an upper terminal, provided on an upper surface of the package body, to which an electrode of a second component body disposed above the first component body is electrically coupled;
a part of the plurality of mounting electrodes being coupled to the external terminal while another part thereof being electrically coupled to an upper terminal; and
a part of the upper terminals being electrically coupled to corresponding one of the external terminals.

10. A package for an electronic component that accommodates a component body, comprising:
a package body having a base sheet at a bottom portion;
a plurality of mounting electrodes, provided on respective one of both sides of an upper surface of the base sheet of the package body in a predetermined number greater than a number of connecting electrodes of the component body, and which is selected in accordance with rotation of the component body to be selectively bonded with connecting electrodes; and
a plurality of external terminals formed on a lower surface of a package body, electrically coupled to the mounting electrodes, for bonding with a mounting board, and being isolated from each other.

11. The package for an electronic component according to claim 10,
a part of the external terminals being electrically coupled to more than one of the mounting electrodes.

12. A method of manufacturing a piezoelectric device using a package for an electronic component according to claim 1, comprising:
selecting the mounting electrodes in accordance with a required specification to bond the connecting electrodes of a piezoelectric vibrator element therewith.

* * * * *